United States Patent
Joe et al.

(10) Patent No.: US 10,408,886 B2
(45) Date of Patent: Sep. 10, 2019

(54) APPARATUS AND METHOD FOR ESTIMATING SOC OF SECONDARY BATTERY INCLUDING BLENDED CATHODE MATERIAL

(71) Applicant: LG CHEM, LTD., Seoul (KR)

(72) Inventors: Won-Tae Joe, Daejeon (KR); Sun-Young Cha, Seoul (KR)

(73) Assignee: LG CHEM, LTD., Seoul (KR)

( * ) Notice: Subject to any disclaimer, the term of this patent is extended or adjusted under 35 U.S.C. 154(b) by 1059 days.

(21) Appl. No.: 14/568,199

(22) Filed: Dec. 12, 2014

(65) Prior Publication Data

US 2015/0100260 A1    Apr. 9, 2015

Related U.S. Application Data

(63) Continuation of application No. PCT/KR2013/002141, filed on Mar. 15, 2013.

(30) Foreign Application Priority Data

Jun. 13, 2012 (KR) .................. 10-2012-0063329
Mar. 15, 2013 (KR) .................. 10-2013-0028297

(51) Int. Cl.
  *G01R 31/382* (2019.01)
  *H01M 4/36* (2006.01)
  (Continued)

(52) U.S. Cl.
  CPC ......... *G01R 31/382* (2019.01); *G01R 31/367* (2019.01); *G01R 31/3835* (2019.01);
  (Continued)

(58) Field of Classification Search
  CPC .................................................. G01R 31/3606
  See application file for complete search history.

(56) References Cited

U.S. PATENT DOCUMENTS

2004/0191617 A1*  9/2004  Visco .............. H01M 2/1673
                                              429/137
2006/0091862 A1*  5/2006  Melichar ............ G01R 31/3648
                                              320/132
(Continued)

FOREIGN PATENT DOCUMENTS

CN         1943060 A      4/2007
JP      2006-351418 A     12/2006
(Continued)

OTHER PUBLICATIONS

Espacenet machine translation of JP 2010-027409, dated May 29, 2018.*

(Continued)

*Primary Examiner* — John E Breene
*Assistant Examiner* — Jeffrey C Morgan
(74) *Attorney, Agent, or Firm* — Birch, Stewart, Kolasch & Birch, LLP

(57) ABSTRACT

Disclosed is an apparatus for estimating a state of charge (SOC) of a secondary battery which includes (i) a cathode comprising a blended cathode material having a first cathode material and a second cathode material, wherein the first and second cathode materials have different operating voltage ranges; (ii) an anode comprising an anode material; and (iii) a separator for separating the cathode from the anode. The apparatus includes a sensor configured to measure a dynamic voltage of the secondary battery during charging of the secondary battery, and a control unit configured to identify a dynamic voltage profile of the secondary battery as a transition region voltage pattern, calculate a parameter of the transition region voltage pattern, and estimate a SOC of the secondary battery from the calculated parameter by using a predetermined relationship between the parameter and the SOC.

24 Claims, 7 Drawing Sheets

(51) Int. Cl.
    *H01M 10/48*     (2006.01)
    *G01R 31/367*     (2019.01)
    *G01R 31/3835*     (2019.01)
    *H01M 4/02*     (2006.01)
    *G01R 31/3828*     (2019.01)

(52) U.S. Cl.
    CPC ........... *H01M 4/364* (2013.01); *H01M 10/48* (2013.01); *G01R 31/3828* (2019.01); *H01M 2004/028* (2013.01)

(56) References Cited

U.S. PATENT DOCUMENTS

| | | |
|---|---|---|
| 2008/0162059 A1 | 7/2008 | Murakami |
| 2008/0213668 A1 | 9/2008 | Muraoka et al. |
| 2010/0085057 A1 | 4/2010 | Nishi et al. |
| 2012/0191390 A1 | 7/2012 | Kang et al. |

FOREIGN PATENT DOCUMENTS

| | | |
|---|---|---|
| JP | 2007-166789 A | 6/2007 |
| JP | 2007-250299 A | 9/2007 |
| JP | 2008-243373 A | 10/2008 |
| JP | 2010-203854 A | 9/2010 |
| KR | 10-2007-0103406 A | 10/2007 |
| KR | 10-2009-0020470 A | 2/2009 |
| KR | 10-2010-0019256 A | 2/2010 |

OTHER PUBLICATIONS

International Search Report issued in PCT/KR2013/002141, dated Jul. 25, 2013.
Paul Albertus et al. "Experiments on and Modeling of Positive Electrodes with Multiple Active Materials for Lithium-Ion Batteries", Journal of the Electrochemical Society, vol. 156, No. 7, Jan. 1, 2009, pp. A606-A618, XP055204069, ISSN: 0013-4651, DOI: 10.1149/1.3129656.

* cited by examiner

APPARATUS AND METHOD FOR ESTIMATING SOC OF SECONDARY BATTERY INCLUDING BLENDED CATHODE MATERIAL

CROSS-REFERENCE TO RELATED APPLICATION

The present application is a continuation of International Application No. PCT/KR2013/002141 filed on Mar. 15, 2013, which claims priority to Korean Patent Application No. 10-2012-0063329 filed on Jun. 13, 2012, and Korean Patent Application No. 10-2013-0028297 filed on Mar. 15, 2013, in the Republic of Korea, the disclosures of which are incorporated herein by reference.

TECHNICAL FIELD

The present disclosure relates to a method and apparatus for estimating a SOC of a secondary battery.

BACKGROUND ART

A battery generates electric energy by oxidation and reduction reactions and is widely used in various ways. For example, a battery is applied to portable devices such as cellular phones, laptops, digital cameras, video cameras, tablet computers, and electric tools; electric-driven apparatuses such as electric bikes, motor cycles, electric vehicles, hybrid vehicles, electric ships, and electric airplanes; power storage devices used for storing power generated by new regeneration energy or surplus energy of a power plant; uninterrupted power supplies for stably supplying power to various information communication devices such as server computers and base stations for communication, and so on.

A battery includes three basic components: an anode containing material which is oxidized while emitting electrons during discharge, a cathode containing material which is reduced while accepting electrons during discharge, and an electrolyte allowing the transfer of operating ions between the anode and the cathode.

Batteries may be classified into primary batteries which are not reusable after discharge, and secondary batteries which allow repeated charge and discharge since their electrochemical reaction is at least partially reversible.

The secondary batteries include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries and so on, as well known in the art. Among them, lithium secondary batteries are drawing the most attention due to their high energy density, high battery voltage and long life cycle in comparison to other secondary batteries. In the lithium secondary battery, the material used as the cathode material greatly influences the performance of the secondary battery. Therefore, various attempts are being made to provide cathode materials having high-temperature stability, large energy capacity, long life span and low production costs.

DISCLOSURE

Technical Problem

The present disclosure is directed to providing a blended cathode material, which may remedy shortcomings of individual cathode materials by blending at least two kinds of cathode materials, and an apparatus and method for estimating a SOC of a secondary battery including the blended cathode material.

Technical Solution

In one aspect of the present disclosure, there is provided an apparatus for estimating a state of charge (SOC) of a secondary battery which includes (i) a cathode comprising a blended cathode material having a first cathode material and a second cathode material, wherein the first and second cathode materials have different operating voltage ranges; (ii) an anode comprising an anode material; and (iii) a separator for separating the cathode from the anode, the apparatus including a sensor configured to measure a dynamic voltage of the secondary battery during charging of the secondary battery; and a control unit configured to identify a dynamic voltage profile of the secondary battery as a transition region voltage pattern, calculate a parameter of the transition region voltage pattern, and estimate a SOC of the secondary battery from the calculated parameter by using a predetermined relationship between the parameter and the SOC.

Here, SOC represents an amount of electric energy stored in the secondary battery and is known as a parameter of the State Of Charge. The SOC may be quantitatively expressed by using parameters of SOC and z. When the SOC is expressed in percentage, the SOC parameter is used, and when the SOC is expressed as a value not greater than 1, the z parameter is used. The SOC may be measured by means of ampere counting, without being limited thereto.

In addition, the transition region voltage pattern means a voltage profile having an inflection point and shaped to have a curvature variation based on the inflection point. For example, the curvature changes from a concave shape into a convex shape. The transition region voltage pattern is generated in a SOC region where reaction kinetics changes while the secondary battery is being charged. In other case, the transition region voltage pattern is generated in a SOC region where the kind of cathode material mainly reacting with operation ions changes. Hereinafter, for convenience, a SOC region where the transition region voltage pattern is generated is defined as a transition region.

In addition, the dynamic voltage means a voltage measured while the secondary battery is being charged or discharged. Therefore, even though the SOC of a secondary battery is identical, the dynamic voltage is different from an open-circuit voltage measured when the secondary battery is in a no-load state. This difference is caused by IR effects, polarization effects or the like which occur when the secondary battery is charged or discharged. However, the dynamic voltage exhibits a variation pattern similar to the open-circuit voltage according to the change of SOC. For example, if the profile of the open-circuit voltage has a curvature variation in a specific SOC region, the profile of the dynamic voltage may also have a curvature variation in the same SOC region.

The operating ion means an ion electrochemically reacting with the first and second cathode materials while the secondary battery is charged or discharged. The operating ion may vary depending on the kind of the secondary battery. For example, in case of a lithium secondary battery, the operating ion may be a lithium ion.

The reaction represents an electrochemical reaction including oxidation and reduction reactions of the first and second cathode materials, accompanied by the charging or discharging process of the secondary battery, and may vary depending on the operating mechanism of the secondary battery. For example, the electrochemical reaction may mean that an operating ion is intercalated into or deintercalated from the first cathode material and/or the second cathode material. In this case, the concentration of the operating ion intercalated into or deintercalated from the first and/or second cathode material may vary according to the change of the voltage of the secondary battery. For example, in a certain voltage range, the operating ion may be preferentially intercalated into the first cathode material in comparison to the second cathode material, and in another voltage range, the operating ion may be preferentially intercalated into the second cathode material in comparison to the first cathode material. In addition, in a certain voltage range, the operating ion may be preferentially deintercalated from the second cathode material in comparison to the first cathode material, and in another voltage range, the operating ion may be preferentially deintercalated from the first cathode material in comparison to the second cathode material. In other words, when the secondary battery is in a charging or discharging mode, the first cathode material and the second cathode material may have different operating voltage ranges at which they are activated. Here, activation of the first cathode material and the second cathode material means that the corresponding cathode material performs electrochemical reactions with operation ions.

In an embodiment, in order to satisfy the condition that the concentration of operating ions reacting with the first and second cathode materials vary according to the voltage, the first and second cathode materials may meet at least one of the following conditions.

For example, when dQ/dV distribution of each cathode material is measured, the first and second cathode materials may be different in locations and/or intensities of main peaks appearing in the dQ/dV distribution.

Here, the dQ/dV distribution represents a capacity characteristic of the cathode material at each voltage as to the operating ion. The difference in locations and/or intensities of the main peaks may be changed depending on the kinds of the first and second cathode materials.

In another embodiment, when measuring a discharge resistance of the lithium secondary battery containing the first and second cathode materials at each SOC, the discharge resistance profile may have a convex pattern.

In another example, when a discharge resistance of the secondary battery containing the first and second cathode materials for each SOC is measured, the discharge resistance profile may have at least two inflection points before and after the convex pattern.

In another example, the open circuit voltage profile of the secondary battery containing the first and second cathode materials may have at least one voltage plateau.

Here, the voltage plateau means a region where an inflection point exists and the curvature of the profile is changed before or after the inflection point.

In another example, at least one of the first and second cathode materials may have a voltage profile with a voltage plateau.

In an embodiment, the first cathode material may be an alkali metal compound expressed by a general chemical formula $A[A_xM_y]O_{2+z}$ (A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the compound maintains electrically neutral).

Optionally, the first cathode material may be an alkali metal compound expressed by $xLiM^1O_2\text{-}(1-x)Li_2M^2O_3$ wherein $M^1$ includes at least one element with an average oxidation state of $+3$; $M^2$ includes at least one element with an average oxidation state of $+4$; and $0 \leq x \leq 1$, which is disclosed in U.S. Pat. Nos. 6,677,082, 6,680,143 or the like.

In another embodiment, the second cathode material may be lithium metal phosphate expressed by a general chemical formula $Li_aM^1{}_xFe_{1-x}M^2{}_yP_{1-y}M^3{}_zO_{4-z}$ ($M^1$ is at least one element selected from the group consisting of Ti, Si, Mn, Co, V, Cr, Mo, Fe, V, Cr, Mo, Ni, Nd, Mg and Al; $M^2$ is at least one element selected from the group consisting of Ti, Si, Mn, Co, V, Cr, Mo, Fe, Ni, Nd, Mg, Al, As, Sb, Si, Ge, V and S; $M^3$ is at least one element of a halogen group selectively containing F; $0 < a \leq 2$, $0 \leq x \leq 1$, $0 \leq y < 1$, $0 \leq z < 1$; and a, x, y, z, and stoichiometric coefficients of the components included in $M^1$, $M^2$, and $M^3$ are selected so that the compound maintains electrically neutral) or $Li_3M_2(PO_4)_3$ [M is at least one element selected from the group consisting of Ti, Si, Mn, Fe, Co, V, Cr, Mo, Ni, Mg and Al].

In another embodiment, the first cathode material may be an alkali metal compound expressed by $Li[Li_aNi_bCo_cMn_d]O_{2+z}$ ($a \geq 0$; $a+b+c+d=1$; at least one of b, c and d is not zero; $-0.1 \leq z \leq 2$). In addition, the second cathode material may be at least one selected from the group consisting of $LiFePO_4$, $LiMn_xFe_yPO_4$ ($0 < x+y \leq 1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, V, Cr, Mo, Fe, Ni, Nd, Mg, Al, As, Sb, Si, Ge, V and S.

In the present disclosure, a blending ratio of the first and second cathode materials may be suitably adjusted according to an electrochemical design condition considering the use of a secondary battery to be manufactured.

In addition, the number of cathode materials capable of being included in the blended cathode material is not limited to two. In an embodiment, the blended cathode material may include three kinds of cathode materials different from each other, for example a blended cathode material including $LiMn_2O_4$, $Li[Li_aNi_xCo_yMn_zO_2$ [$a \geq 0$; $a+x+y+z=1$; at least one of x, y and z is not zero] and $LiFePO_4$. In another embodiment, the blended cathode material may have four kinds of cathode materials different from each other, for example a blended cathode material including $LiNiO_2$, $LiMn_2O_4$, $Li[Li_aNi_xCo_yMn_zO_2$ [$a \geq 0$; $a+x+y+z=1$; at least one of x, y and z is not zero] and $LiFePO_4$. In addition, in order to improve properties of the blended cathode material, other additives such as a conducting agent and a binder may be added to the blended cathode material without special restriction.

In an embodiment, the control unit may identify the dynamic voltage profile as a transition region voltage pattern when the dynamic voltage profile has an inflection point, the dynamic voltage profile has different curvatures, or a first-order differential value of the dynamic voltage profile has a maximum value.

In an embodiment, the calculated parameter may include at least one selected from the group consisting of an initial charge voltage ($V_{initial}$) at which a voltage starts increasing in the identified transition region voltage pattern, a final charge voltage ($V_{final}$) at which a voltage ends increasing in the identified transition region voltage pattern, a time ($\tau$) taken until the inflection point occurs from a point when a voltage starts increasing in the identified transition region voltage pattern, dV/dt at the inflection point, dV/dSOC (dSOC is obtained by calculating a capacity variation per unit time by means ampere counting) at the inflection point, a time ($\Delta T$) taken for the dynamic voltage of the secondary battery to change from the initial charge voltage to the final charge voltage, an integral value of the entire identified transition region voltage pattern, and an integral value obtained by integrating the transition region voltage pattern in a predetermined time range before or after the inflection point.

In an embodiment, the predetermined relationship may be a look-up table in which a relationship between the parameter and the SOC is predetermined.

In another embodiment, the predetermined relationship may be a look-up function which uses the parameter as input parameters and the SOC as an output parameter.

Here, the relationship may be predetermined under the same charging condition as a charging condition under which the dynamic voltage is measured.

The SOC estimating apparatus according to the present disclosure may further include a storage unit in which the look-up table and/or the look-up function is stored.

In an embodiment, the estimated SOC may be a SOC before the charging starts or a SOC after the charging is completed.

In another embodiment, the sensor may measure a current of the secondary battery during charging, and the control unit may estimate a SOC before the charging starts, then integrate the measured current to calculate a SOC variance amount, and apply the SOC variance amount to the estimated SOC to estimate a SOC after the charging is completed.

In the present disclosure, the charging may be pulse charging which repeats at time intervals. In this case, the control unit may estimate a SOC of the secondary battery whenever the pulse charging repeats. Optionally, during each pulse charging, the control unit may estimate a SOC of the secondary battery whenever the dynamic voltage profile is identified as the transition region voltage pattern.

The SOC estimating apparatus according to the present disclosure may further include a display unit for displaying the estimated SOC as a graphic interface, and the control unit may output the estimated SOC on the display unit.

The SOC estimating apparatus according to the present disclosure may further include a storage unit storing the estimated SOC, and the control unit may store the estimated SOC in the storage unit.

In the present disclosure, the control unit may output the estimated SOC to the outside.

In another aspect of the present disclosure, the control unit may calculate an inflection point identifier from the measured dynamic voltage, determine a parameter corresponding to a transition region voltage pattern when the inflection point identifier satisfies a condition under which an inflection point occurs (or, an inflection point occurrence condition), and estimate a SOC of the secondary battery from the calculated parameter by using a predetermined relationship between the parameter and the SOC of the secondary battery.

Preferably, the inflection point identifier may be updated whenever the dynamic voltage is measured by the sensor.

In the present disclosure, the inflection point identifier is used to determine whether the dynamic voltage measured by the sensor forms an inflection point as time goes.

For example, the inflection point identifier may be a first-order differential value (dV/dt) of the dynamic voltage with respect to a measurement time of the dynamic voltage.

In this case, the inflection point occurrence condition is a condition that the first-order differential value has a maximum value.

As another example, the inflection point identifier may be a secondary differential value ($d^2V/d^2t$) of the dynamic voltage with respect to a measurement time of the dynamic voltage. In this case, the inflection point occurrence condition is a condition that the secondary differential value becomes 0.

As another example, the inflection point identifier may be a first-order differential value (dV/dSOC) of the dynamic voltage with respect to the SOC of the secondary battery. In this case, the inflection point occurrence condition is a condition that the first-order differential value has a maximum value.

As described above, in an embodiment where the inflection point identifier is utilized, the control unit may determine at least one selected from the group of an initial charge voltage ($V_{initial}$), a final charge voltage ($V_{final}$), a time ($\tau$) taken from the initial charge point until the condition under which the inflection point occurs is satisfied, dV/dt (V=dynamic voltage) when the condition under which the inflection point occurs is satisfied, dV/dSOC (V=dynamic voltage, SOC=SOC) when the condition under which the inflection point occurs is satisfied, a time ($\Delta T$) taken for the dynamic voltage of the secondary battery to change from the initial charge voltage to the final charge voltage, a voltage integral value from the initial charge voltage to the final charge voltage, and an integral value of the measured dynamic voltage in a predetermined time range before or after the point when the condition under which the inflection point occurs is satisfied, as a parameter corresponding to the transition region voltage pattern.

In addition, in an embodiment where the inflection point identifier is utilized, the control unit may estimate a SOC of the secondary battery from the determined parameter by using a look-up table in which a relationship between the parameter and the SOC is defined.

In addition, in an embodiment where the inflection point identifier is utilized, the control unit may estimate a SOC of the secondary battery from the determined parameter by using a look-up function in which the parameter is an input variable and the SOC is an output variable.

In another aspect of the present disclosure, there is also provided an apparatus for estimating an SOC of a secondary battery which includes (i) a cathode comprising a blended cathode material having a first cathode material and a second cathode material, wherein the first and second cathode materials have different operating voltage ranges; (ii) an anode comprising an anode material; and (iii) a separator for separating the cathode from the anode, and is loaded on an electric vehicle supporting a hybrid electric vehicle (HEV) mode, the apparatus including a sensor configured to measure a dynamic voltage of the secondary battery during charging of the secondary battery in the HEV mode; and a control unit configured to identify a dynamic voltage profile of the secondary battery as a transition region voltage pattern, calculate a parameter of the transition region voltage pattern, and estimate a SOC of the secondary battery from the calculated parameter by using a predetermined relationship between the parameter and the SOC.

In this modified embodiment, as an alternative, the control unit may calculate an inflection point identifier from the measured dynamic voltage, determine a parameter corresponding to a transition region voltage pattern when the inflection point identifier satisfies a condition under which an inflection point occurs, and estimate a SOC of the secondary battery from the calculated parameter by using a predetermined relationship between the parameter and the SOC of the secondary battery.

In an embodiment, the control unit may estimate the SOC at each charging cycle when charging and discharging cycles of the secondary battery repeat in the HEV mode.

In another embodiment, the charging may be pulse charging which repeats at time intervals. In this case, the control unit may estimate a SOC of the secondary battery whenever the pulse charging repeats. Optionally, during each pulse charging, the control unit may estimate a SOC of the secondary battery whenever the dynamic voltage profile is identified as the transition region voltage pattern.

In another aspect of the present disclosure, there is also provided an apparatus for estimating an SOC of a secondary battery which includes (i) a cathode comprising a blended cathode material having a first cathode material and a second cathode material, wherein the first and second cathode materials have different operating voltage ranges; (ii) an anode comprising an anode material; and (iii) a separator for separating the cathode from the anode, and is loaded on an electric vehicle supporting a electric vehicle (EV) mode, the apparatus including a sensor configured to measure a dynamic voltage of the secondary battery during charging of the secondary battery in the EV mode; and a control unit configured to identify a dynamic voltage profile of the secondary battery as a transition region voltage pattern, calculate a parameter of the transition region voltage pattern, and estimate a SOC of the secondary battery from the calculated parameter by using a predetermined relationship between the parameter and the SOC.

In this modified embodiment, as an alternative, the control unit may calculate an inflection point identifier from the measured dynamic voltage, determine a parameter corresponding to a transition region voltage pattern when the inflection point identifier satisfies a condition under which an inflection point occurs, and estimate a SOC of the secondary battery from the calculated parameter by using a predetermined relationship between the parameter and the SOC of the secondary battery.

In another aspect of the present disclosure, there is also provided a method for estimating a SOC of a secondary battery which includes (a) a cathode comprising a blended cathode material having a first cathode material and a second cathode material, wherein the first and second cathode materials have different operating voltage ranges; (b) an anode comprising an anode material; and (c) a separator for separating the cathode from the anode, the method comprising: (a) measuring a dynamic voltage of the secondary battery during charging of the secondary battery; (b) identifying a dynamic voltage profile of the secondary battery as a transition region voltage pattern; (c) calculating a parameter of the identified transition region voltage pattern; and (d) estimating a SOC of the secondary battery from the calculated parameter by using a predetermined relationship between the parameter and the SOC.

In this modified embodiment, the steps (b) to (d) may be replaced with a step of calculating an inflection point identifier from the measured dynamic voltage; a step of determining a parameter corresponding to a transition region voltage pattern when the inflection point identifier satisfies a condition under which an inflection point occurs, and a step of estimating a SOC of the secondary battery from the calculated parameter by using a predetermined relationship between the parameter and the SOC.

In another aspect of the present disclosure, there is also provided a method for estimating a SOC of a secondary battery which includes (i) a cathode comprising a blended cathode material having a first cathode material and a second cathode material, wherein the first and second cathode materials have different operating voltage ranges; (ii) an anode comprising an anode material; and (iii) a separator for separating the cathode from the anode, and is loaded on an electric vehicle supporting a hybrid electric vehicle (HEV) mode, the method comprising: (a) initiating charging of the secondary battery in the HEV mode; (b) measuring a dynamic voltage of the secondary battery during the charging; (c) identifying a dynamic voltage profile of the secondary battery as a transition region voltage pattern; (d) calculating a parameter of the transition region voltage pattern; and (e) estimating a SOC of the secondary battery from the calculated parameter by using a predetermined relationship between the parameter and the SOC.

In this modified embodiment, the steps (c) to (e) may be replaced with a step of calculating an inflection point identifier from the measured dynamic voltage; a step of determining a parameter corresponding to a transition region voltage pattern when the inflection point identifier satisfies a condition under which an inflection point occurs, and a step of estimating a SOC of the secondary battery from the calculated parameter by using a predetermined relationship between the parameter and the SOC.

The method for estimating a SOC according to the present disclosure may further include a step of repeating charging and discharging cycles of the secondary battery in the HEV mode, and the steps (b) to (e) may repeat in each charging cycle.

In the method for estimating a SOC according to the present disclosure, the charging may be pulse charging which repeats at time intervals. In this case, the steps (b) to (e) may repeat whenever the pulse charging repeats. Optionally, during each pulse charging, the steps (b) to (e) may repeat when the condition of identifying the dynamic voltage profile as the transition region voltage pattern is established.

The method for estimating SOC of a secondary battery according to the present disclosure may include displaying the estimated SOC as a graphic interface, and/or storing the estimated SOC, and/or outputting the estimated SOC to the outside.

The apparatus and method for estimating SOC of a secondary battery according to the present disclosure may be applied to estimate a SOC of a secondary battery loaded on various kinds of electric-driven apparatuses which may operate by electric energy.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy of a power plant, or an uninterrupted power supply for supplying power to various information communication devices such as server computers and mobile communication devices in times of emergency such as a blackout.

Advantageous Effects

According to an aspect of the present disclosure, a secondary battery including a blended cathode material, even in a SOC region where the secondary battery exhibits an unusual voltage behavior, a SOC of the secondary battery may be reliably estimated. Therefore, even though the secondary battery repeats charging and discharging as an electric vehicle on which the secondary battery is loaded operates in a HEV mode, it is possible to solve the problem that an estimation error of SOC continuously increases.

According to another aspect of the present disclosure, since the SOC may be reliably measured in the SOC region where distinctive voltage behaviors are exhibited, cathode materials, which were not capable of being blended due to distinctive voltage behaviors, may be blended into various combinations. Therefore, by selecting two or more cathode materials among various kinds of available cathode materials and blending them into various combinations according to the usage purpose of a secondary battery, it is possible to provide a blended cathode material most appropriately optimized for the usage purpose of the secondary battery.

DESCRIPTION OF DRAWINGS

The accompanying drawing illustrates a preferred embodiment of the present disclosure and together with the foregoing disclosure, serves to provide further understanding of the technical spirit of the present disclosure. However, the present disclosure is not construed as being limited to the drawing.

BEST MODE

Figure 1:
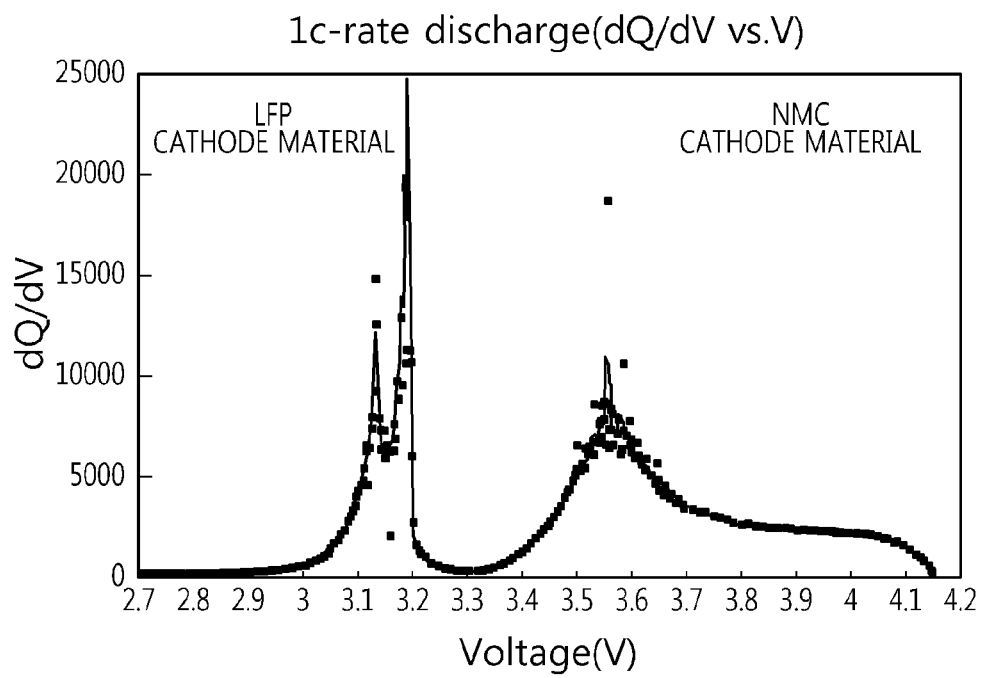
FIG. 1 is a graph showing dQ/dV distribution of a lithium secondary battery having Li[Ni$_{1/3}$Mn$_{1/3}$Co$_{1/3}$]O$_2$ (NMC cathode material) and LiFePO$_4$ (LFP cathode material)

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below are based on cases where the present disclosure is applied to a lithium secondary battery. Here, the lithium secondary battery is a general name of a secondary battery where lithium ions serve as operating ions during charge and discharge to cause electrochemical reactions at a cathode and an anode. The operating ions mean ions participating in electrochemical oxidizing and reducing reactions while the secondary battery is charged or discharged, and may be, for example, lithium. Therefore, even though secondary batteries are called differently according to the kind of electrolyte or separator used in the lithium secondary battery, the kind of package used for packing the secondary battery, or the internal or external structure of the lithium secondary battery, such secondary batteries should be interpreted as being included in the scope of the lithium secondary battery if lithium ions are used as operating ions.

In addition, the present disclosure may also be applied to various kinds of secondary batteries other than the lithium secondary batteries. Therefore, all kinds of secondary batteries should be interpreted as being included in the scope of the present disclosure if the spirit of the present disclosure may be applied even though their operating ion is not a lithium ion.

Moreover, the number of its components used in the secondary battery is not specially limited. Therefore, the secondary battery should be interpreted as including a unit cell having an anode, an electrolyte and a cathode as a basic unit, an assembly of unit cells, a module having a plurality of assemblies connected in series and/or in parallel, a pack having a plurality of modules connected in series and/or in parallel, a battery system having a plurality of packs connected in series and/or in parallel, or the like.

In this embodiment, a cathode of a secondary battery whose SOC is estimated includes a blended cathode material. The blended cathode material includes at least a first cathode material and a second cathode material, and the first and second cathode materials have different operating voltage ranges. In other words, concentration of operation ions reacting with the first cathode material and concentration of operation ions reacting with the second cathode material may exhibit difference with respect to a dynamic voltage of the secondary battery while the secondary battery is being charged or discharged. Here, the dynamic voltage means a voltage measured when the secondary battery is being charged or discharged. The operation ions mean ions which make electrochemical reactions with the first and second cathode materials while the secondary battery is being charged or discharged. If the secondary battery is a lithium secondary battery, lithium ions correspond to the operation ions.

The reaction represents an electrochemical reaction including oxidation and reduction reactions of the first and second cathode materials, accompanied by the charging or discharging process of the secondary battery, and may vary depending on the operating mechanism of the secondary battery.

For example, the electrochemical reaction may mean that an operating ion is intercalated into or deintercalated from the first cathode material and/or the second cathode material. In this case, the concentration of the operating ion intercalated into or deintercalated from the first and/or second cathode material may vary according to the change of the dynamic voltage of the secondary battery.

For example, in a condition where the secondary is discharged, operating ions may be preferentially intercalated into the first cathode material in comparison to the second cathode material, and in another voltage range, operating ions may be preferentially intercalated into the second cathode material in comparison to the first cathode material.

As another example, in a condition where the secondary is charged, operating ions may be preferentially deintercalated from the second cathode material in comparison to the first cathode material, and in another voltage range, operating ions may be preferentially deintercalated from the first cathode material in comparison to the second cathode material.

In an embodiment, in order to satisfy the condition that the concentration of operating ions reacting with the first and second cathode materials vary according to the dynamic voltage, the first and second cathode materials may meet at least one of the following conditions.

For example, when dQ/dV distribution of the first and second cathode materials is measured, the cathode materials may be different from each other in locations of their main peaks and/or intensities of the main peaks exhibited in the dQ/dV distribution.

Here, the dQ/dV distribution, as known in the art, represents a capacity characteristic of the cathode material at various operating voltages. The difference in locations and/or intensities of the main peaks may be changed depending on the kinds of the first and second cathode materials.

FIG. 1 is a graph showing measurement results of dQ/dV distribution, obtained by applying 1 c-rate discharge condition to a lithium secondary battery having a blended cathode material where $Li[Ni_{1/3}Mn_{1/3}Co_{1/3}]O_2$ (hereinafter, NMC cathode material) and $LiFePO_4$ (hereinafter, LFP cathode material) are blended at a ratio of 7:3 (a weight ratio).

Referring to FIG. 1, it may be found that the left peak corresponds to a main peak of the LFP cathode material, the right peak corresponds to a main peak of the NMC cathode material, and the LFP cathode material and the NMC cathode material different from each other in locations of their main peaks and/or intensities of the main peaks. In addition, profiles around the main peak of the LFP cathode material are generated as lithium ions react with the LFP cathode material, and profiles around the main peak of the NMC cathode material are generated as lithium ions react with the NMC cathode material. Therefore, in a low voltage range, the LFP cathode material mainly reacts with lithium ions, and in a high voltage range, the NMC cathode material mainly reacts with lithium ions. This dQ/dV measurement results clearly support that the NMC cathode material and the LFP cathode material have different operating voltage ranges since concentrations of operation ions reacting with the NMC cathode material and the LFP cathode material vary according to the change of dynamic voltage of the secondary battery.

As another example, if concentrations of operation ions reacting with the first and second cathode materials vary according to the dynamic voltage of the secondary battery, when measuring a discharge resistance of the lithium secondary battery containing the blended cathode material at various SOCs, the discharge resistance profile may have a convex pattern or the discharge resistance profile may have two inflection points before and after the peak of the convex pattern.

Figure 2:
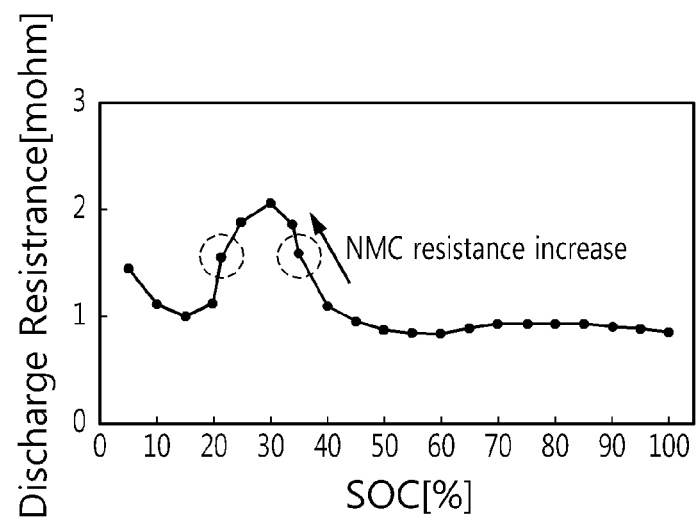
FIG. 2 is a graph showing a discharge resistance profile of a lithium secondary battery having an NMC cathode material and an LFP cathode material.

FIG. 2 is a discharge resistance profile showing measurement results of a discharge resistance according to the change of SOC with respect to a lithium secondary battery including the blended cathode material in a cathode and carbon material in an anode where an NMC cathode material and an LFP cathode material are blended at a ratio of 7:3 (a weight ratio).

Referring to FIG. 2, it may be understood that the discharge resistance profile of the lithium secondary battery including the blended cathode material has a convex pattern when the SOC is about 20 to 40%. In addition, it may also be understood that two inflection points (marked by a dotted circle) occurs when the SOC is in the range of 20 to 30% and in the range of 30 to 40%, respectively, in the discharge resistance profile. Concentrations of operation ions reacting with the NMC cathode material and the LFP cathode material vary according to the change of dynamic voltage of the secondary battery, as described above with reference to FIG. 1. Therefore, it is also obvious that concentrations of operation ions reacting with the first and second cathode materials vary according to the change of dynamic voltage of the secondary battery when a discharge resistance profile of the secondary battery including the first and second cathode materials has a convex pattern or when the discharge resistance profile has two inflection points before and after the peak of the convex pattern.

As another example, if concentrations of operation ions reacting with the first and second cathode materials vary according to the dynamic voltage of the secondary battery, at least one voltage plateau may appear in an open-circuit voltage profile of the secondary battery including a blended cathode material. Here, the voltage plateau means a region in which an inflection point is present and a curvature of the voltage profile varies before and after the inflection point.

Figure 3:
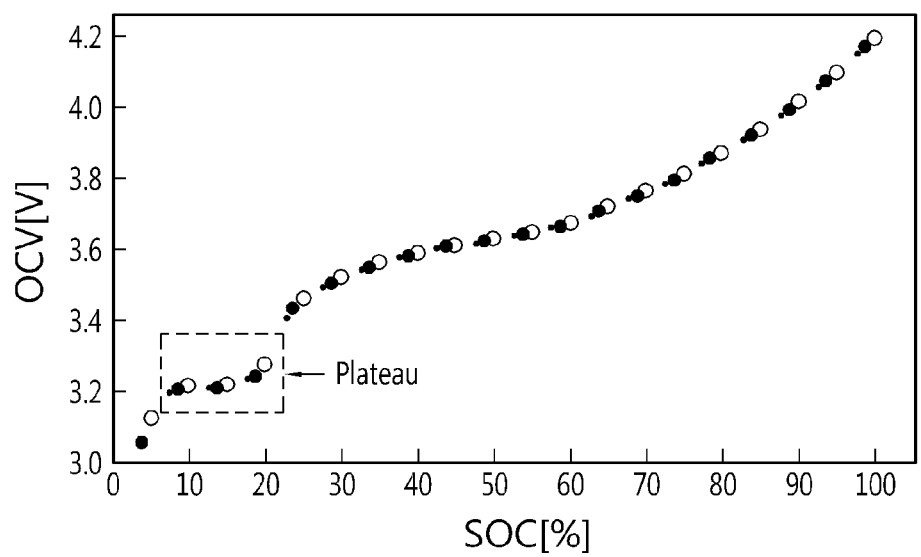
FIG. 3 is a graph showing an open circuit voltage profile of a lithium secondary battery having an NMC cathode material and an LFP cathode material.

FIG. 3 is an open-circuit voltage profile showing measurement results of an open-circuit voltage at various SOCs, obtained while discharging a lithium secondary battery including the blended cathode material in a cathode and carbon material in an anode where an NMC cathode material and an LFP cathode material are blended at a ratio of 7:3 (a weight ratio).

Here, the open-circuit voltage represents a voltage measured in a state where the secondary battery is maintained in a no-load state over a predetermined time and thus the voltage of the secondary battery is stabilized, and the open-circuit voltage is electrochemically different from the dynamic voltage measured when the secondary battery is charged or discharged.

Referring to FIG. 3, it may be found that when the open-circuit voltage is about 3.2V, a voltage plateau is generated in the open-circuit voltage profile. It has been already described with reference to FIG. 1 that the concentrations of operation ions reacting with the NMC cathode material and the LFP cathode material vary according to the change of dynamic voltage of the secondary battery. Therefore, it is also obvious that when the open-circuit voltage profile of the lithium secondary battery including the first and second cathode materials has at least one voltage plateau, concentrations of operation ions reacting with the first and second cathode materials vary according to the change of dynamic voltage of the secondary battery, and thus operating voltage range of the first and second cathode materials may also vary.

Meanwhile, in the open-circuit voltage profile depicted in FIG. 3, the voltage plateau is generated since the kind of cathode material mainly reacting with operation ions changes in a SOC region corresponding to the voltage profile. For example, if the blended cathode material includes NMC cathode material and LFP cathode material, in a voltage range (below about 3.2V), the LFP cathode material mainly reacts with operation ions, and in a high voltage range (over about 3.2V), the NMC cathode material mainly reacts with operation ions. If the kind of cathode material mainly reacting with operation ions changes, dominant reaction kinetics also changes since the NMC cathode material and the LFP cathode material have different reaction kinetics with the operation ions. Therefore, if the open-circuit voltage profile of the secondary battery including a blended cathode material is analyzed, a voltage plateau including an inflection point is observed as shown in FIG. 3. Meanwhile, if a voltage plateau is generated in the open-circuit voltage profile, a voltage plateau is also generated in the dynamic voltage profile. The dynamic voltage is different from the open-circuit voltage due to a voltage component caused by IR effects or polarization effects, but the variation pattern of the dynamic voltage is similar to the variation pattern of the open-circuit voltage. However, in the voltage plateau of the dynamic voltage profile, since a curvature is changed, even though the dynamic voltage of the secondary battery changes just a little, the SOC changes rapidly. Therefore, at the voltage range (near 3.2V) where dominant reaction kinetics of the blended cathode material changes, it is difficult to accurately measure a SOC of the secondary battery by using the dynamic voltage of the secondary battery.

As another example, when at least one of the first and second cathode materials includes a voltage profile having a voltage plateau, concentrations of operation ions reacting with the first and second cathode materials may vary according to the dynamic voltage of the secondary battery.

Figure 4:
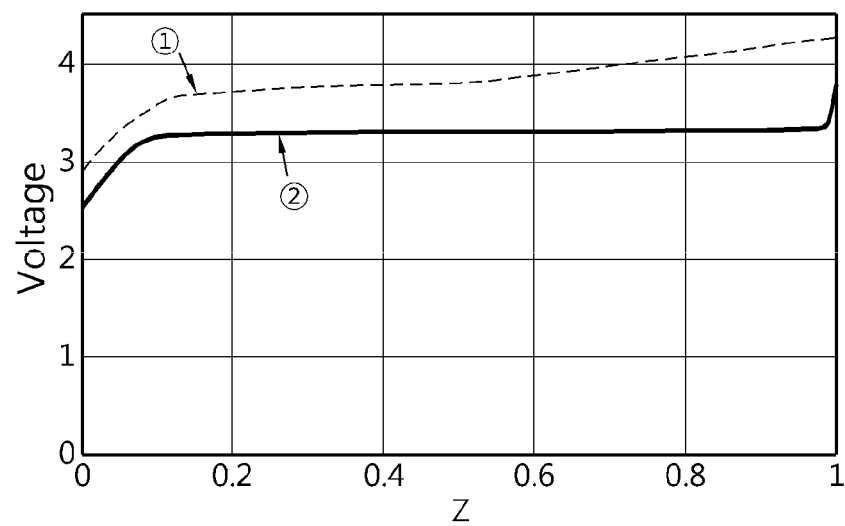
FIG. 4 is a graph showing measurement results of voltage profiles according to SOCs for a half cell manufactured so that an NMC cathode material and a lithium metal are respectively used as a cathode and an anode and a half cell manufactured so that an LFP cathode material and a lithium metal are respectively used as a cathode and an anode.

FIG. 4 is a graph showing measurement results of voltage profiles at a SOC range of 0-1 with respect to a half cell manufactured so that an NMC cathode material and a lithium metal are respectively used as a cathode and an anode and a half cell manufactured so that an LFP cathode material and a lithium metal are respectively used as a cathode and an anode.

In FIG. 4, graph ① depicts a voltage profile of the half cell including the NMC cathode material and graph ② depicts a voltage profile of the half cell including the LFP cathode material.

Referring to FIG. 4, a voltage plateau is observed in the voltage profile of the half cell including the LFP cathode material. This measurement results supports that when at least one of the first and second cathode materials represents a voltage profile having a voltage plateau, concentrations of operation ions reacting with the first and second cathode materials may vary according to the dynamic voltage of the secondary battery.

In the present disclosure, the first and second cathode materials may use any material without limitation. Therefore, any combination of cathode materials satisfying at least one of the above conditions may be considered as the first and second cathode materials, in addition to the NMC cathode material and the LFP cathode material, as obvious to those skilled in the art.

In an embodiment, the first cathode material may be an alkali metal compound expressed by a general chemical formula $A[A_xM_y]O_{2+z}$ (A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x≥0$, $1≤x+y≤2$, $-0.1≤z≤2$; and x, y, z and stoichiometric coefficients of the components included in M are selected so that the compound maintains electrically neutral).

Optionally, the first cathode material may be an alkali metal compound expressed by $xLiM^1O_2-(1-x)Li_2M^2O_3$ wherein $M^1$ includes at least one element with an average oxidation state of +3; $M^2$ includes at least one element with an average oxidation state of +4; and $0≤x≤1$, and selectively coated with a carbon layer, an oxide layer and a fluoride layer, which is disclosed in U.S. Pat. Nos. 6,677,082, 6,680,143 or the like.

In another embodiment, the second cathode material may be lithium metal phosphate expressed by a general chemical formula $Li_aM^1_xFe_{1-x}M^2_yP_{1-y}M^3_zO_{4-z}$ wherein $M^1$ is at least one element selected from the group consisting of Ti, Si, Mn, Co, V, Cr, Mo, Fe, Ni, Nd, Mg and Al; $M^2$ is at least one element selected from the group consisting of Ti, Si, Mn, Co, V, Cr, Mo, Fe, Ni, Nd, Mg, Al, As, Sb, Si, Ge, V and S; $M^3$ is at least one element of a halogen group selectively containing F; $0<a≤2$, $0≤x≤1$, $0≤y<1$, $0≤z<1$; and a, x, y, z, and stoichiometric coefficients of components included in $M^1$, $M^2$, and $M^3$ are selected so that the lithium metal phosphate maintains electrical neutrality or $Li_3M_2(PO_4)_3$ wherein M is at least one element selected from the group consisting of Ti, Si, Mn, Fe, Co, V, Cr, Mo, Ni, Mg and Al.

In another embodiment, the first cathode material may be an alkali metal compound expressed by $Li[Li_aNi_bCo_cMn_d]O_{2+z}$ ($a≥0$; $a+b+c+d=1$; at least one of b, c and d is not zero; $-0.1≤z≤2$). In addition, the second cathode material may be at least one selected from the group consisting of $LiFePO_4$, $LiMn_xFe_yPO_4$ ($0<x+y≤1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, V, Cr, Mo, Fe, Ni, Nd, Mg, Al, As, Sb, Si, Ge, V and S.

In the present disclosure, the blending ratio of the first and second cathode materials may be suitably adjusted according to electrochemical design conditions in consideration of the use of a secondary battery to be manufactured.

In an embodiment, if a secondary battery with a good discharge power is desired, a cathode material having a good reactivity with lithium ions may be selected as one of the first and second cathode materials, and a mixture ratio of the corresponding cathode material may be set as high as possible. For example, Li[Ni$_{1/3}$Mn$_{1/3}$Co$_{1/3}$]O$_2$ and LiFePO$_4$ may be respectively selected as the first cathode material and the second cathode material, and a mixture ratio of the first cathode material and the second cathode material may be set to be 9:1.

In another embodiment, if a secondary battery with high-temperature stability is desired, a cathode material with excellent high-temperature stability may be selected as one of the first and second cathode materials, and a mixture ratio of the corresponding cathode material may be set as high as possible. For example, Li[Ni$_{1/3}$Mn$_{1/3}$Co$_{1/3}$]O$_2$ and LiFePO$_4$ may be respectively selected as the first cathode material and the second cathode material, and a mixture ratio of the first cathode material and the second cathode material may be set to be 2:8.

In another embodiment, if a secondary battery with a low production cost is desired, a cathode material with a low production cost may be selected as one of the first and second cathode materials, and a mixture ratio of the corresponding cathode material may be set as high as possible. For example, Li[Ni$_{1/3}$Mn$_{1/3}$Co$_{1/3}$]O$_2$ and LiFePO$_4$ may be respectively selected as the first cathode material and the second cathode material, and a mixture ratio of the first cathode material and the second cathode material may be set to be 1:9.

In another embodiment, if a secondary battery having a good discharge power and excellent high-temperature stability is desired, a cathode material having a good reactivity with operating ions and a cathode material having excellent high-temperature stability may be respectively selected as the first and second cathode materials, and a mixture ratio of the cathode materials may be set in consideration of balancing of the discharge power and the high-temperature stability. For example, Li[Ni$_{1/3}$Mn$_{1/3}$Co$_{1/3}$]O$_2$ and LiFePO$_4$ may be respectively selected as the first cathode material and the second cathode material, and a mixture ratio of the first cathode material and the second cathode material may be set to be 4:6.

In another embodiment, if a secondary battery having a great capacity per weight is desired, a cathode material having a great capacity per weight may be selected as one of the first and second cathode materials, and a mixture ratio of the corresponding cathode material may be set to be as high as possible. For example, Li[Ni$_{0.5}$Mn$_{0.3}$Co$_{0.2}$]O$_2$ and LiFePO$_4$ may be respectively selected as the first cathode material and the second cathode material, and a mixture ratio of the first cathode material and the second cathode material may be set to be 9:1.

The selection of the first and second cathode materials and the adjustment of their mixture ratio described above are just examples. Therefore, it is obvious to those skilled in the art that the first and second cathode materials may be suitably selected and a mixture ratio of the cathode materials may be suitably set according to design conditions of the secondary battery.

In addition, the number of kinds of cathode materials included in the blended cathode material is not limited to two. In addition, for enhancing properties of the blended cathode material, other additives such as a conducting agent, a binder or the like may be added to the blended cathode material without special limitation.

In an embodiment, the blended cathode material may include three kinds of cathode materials different from each other, for example a blended cathode material including LiMn$_2$O$_4$, Li[Li$_a$Ni$_x$Co$_y$Mn$_z$]O$_2$ [a≤0; a+x+y+z=1; at least one of x, y and z is not zero] and LiFePO$_4$.

In another embodiment, the blended cathode material may have four kinds of cathode materials different from each other, for example a blended cathode material including LiNiO$_2$, LiMn$_2$O$_4$, Li[Li$_a$Ni$_x$Co$_y$Mn$_z$]O$_2$ [a≥0; a+x+y+z=1; at least one of x, y and z is not zero] and LiFePO$_4$.

The secondary battery including the blended cathode material may be loaded on various kinds of electric-driven apparatuses which operate with electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video playing device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy of a power plant, or an uninterrupted power supply for supplying power to various information communication devices such as server computers and mobile communication devices in times of emergency such as a blackout.

Meanwhile, as described above with reference to FIG. 3, the open-circuit voltage profile of the secondary battery containing a blended cathode material has an inflection point, and shows a curvature variation based on the inflection point. The curvature changes because the kind of cathode material mainly reacting with operation ions changes. Therefore, near the inflection point, a variation ratio (ΔSOC/ΔOCV) of SOC in comparison to the open-circuit voltage increases. Hereinafter, the SOC region where a curvature of the open-circuit voltage profile based on the inflection point changes will be called a transition region. The transition region may change according to the kinds or blending ratio of cathode material included in the blended cathode material, and in the open-circuit voltage profile depicted in FIG. 3, the SOC region corresponding to a voltage plateau (a dotted box portion) may correspond to the transition region.

As well known in the art, the SOC of a secondary battery may be estimated as an inherent value by the open-circuit voltage. The open-circuit voltage may be accurately measured when the secondary battery is maintained in a no-load state for a predetermined time. However, while the secondary battery is being charged or discharged, the open-circuit voltage may not be measured, and thus the open-circuit voltage is estimated by using a dynamic voltage of the secondary battery. However, the dynamic voltage has an error from the open-circuit voltage due to IR effects and polarization effects, and in the transition region near the inflection point, the dynamic voltage varies more rapidly according to the change of SOC, which further increases the error. For reference, the dynamic voltage has an error from the open-circuit voltage but has a variation pattern similar to the open-circuit voltage. For this reason, a variation of dynamic voltage in comparison to the SOC also increases in the transition region. Therefore, if SOC is calculated by estimating the open-circuit voltage from the dynamic voltage in the transition region, the reliability inevitably deteriorates. Meanwhile, SOC may be estimated by means of ampere counting, but the ampere counting has deteriorated accuracy since current measurement errors are accumulated as the time for integrating currents of the secondary battery is elongated, and thus the ampere counting may not be a proper alternative.

Meanwhile, as the environmental problems caused by the use of fossil fuel becomes more severe, electric vehicles or hybrid vehicles (hereinafter, generally referred to as electric vehicles) driven by a secondary battery are being actively developed.

Since the electric vehicle is expensive, a manufacturer wants a secondary battery which is cheap, ensures high capacity and power, has a long life cycle and has excellent safety. In order to make a secondary battery meeting the above conditions, the selection of a cathode material is very important. However, most commercialized cathode materials do not meet all the conditions demanded in the market, and thus a blended cathode material obtained by blending two or more cathode materials may be a suitable alternative.

However, since the secondary battery containing a blended cathode material shows a great variation rate of dynamic voltage in comparison to the SOC in the transition region (particularly, near the inflection point), it is difficult to accurately measure the SOC in the transition region.

In an electric vehicle, the SOC is a factor by which a mileage available in the future is weighed. Therefore, if the SOC is not accurately estimated, an accurate available mileage is not given to a driver, which cannot give reliability about the vehicle.

This problem becomes more serious in an electric vehicle which supports a HEV mode. In the HEV mode, a vehicle is driven using an engine and a secondary battery together, and this mode may be applied when the SOC of the secondary battery is low, when the vehicle is capable of running at an economical speed, or when the driver selects this mode.

Figure 5:
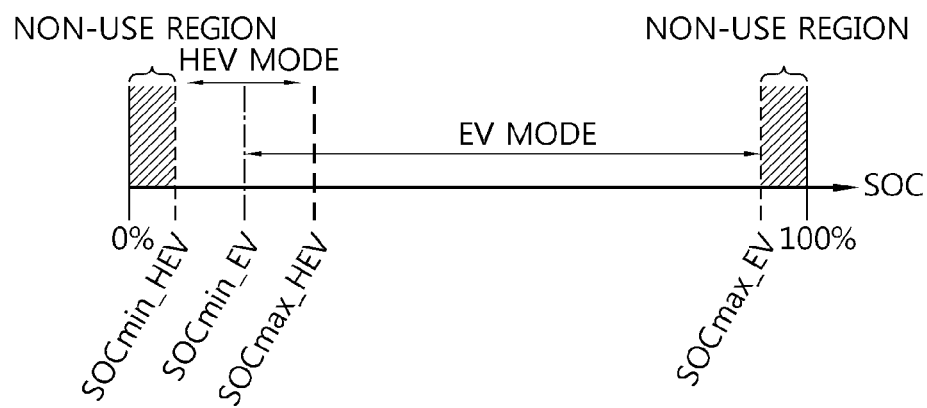
FIG. 5 is a diagram exemplarily showing how to apply a HEV mode in an electric vehicle to which the HEV mode is supported.
Figure 6:
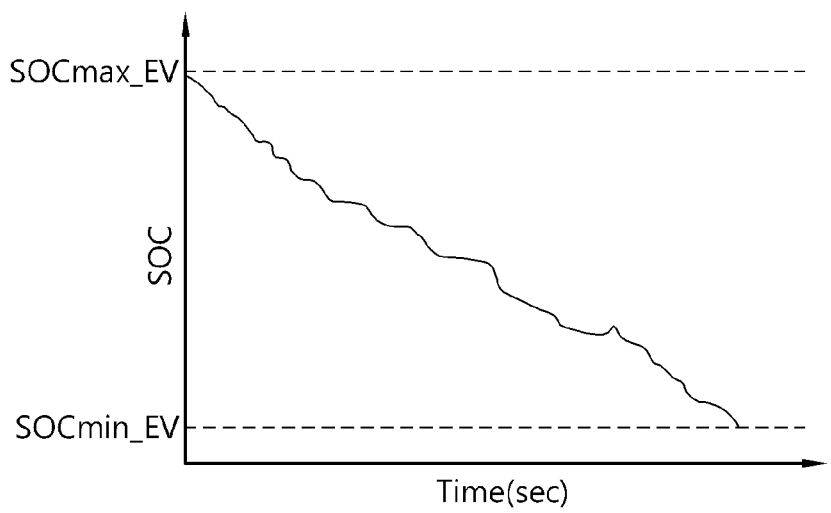
FIG. 6 is a graph showing a change of a SOC of a secondary battery in an EV mode of FIG. 5.
Figure 7:
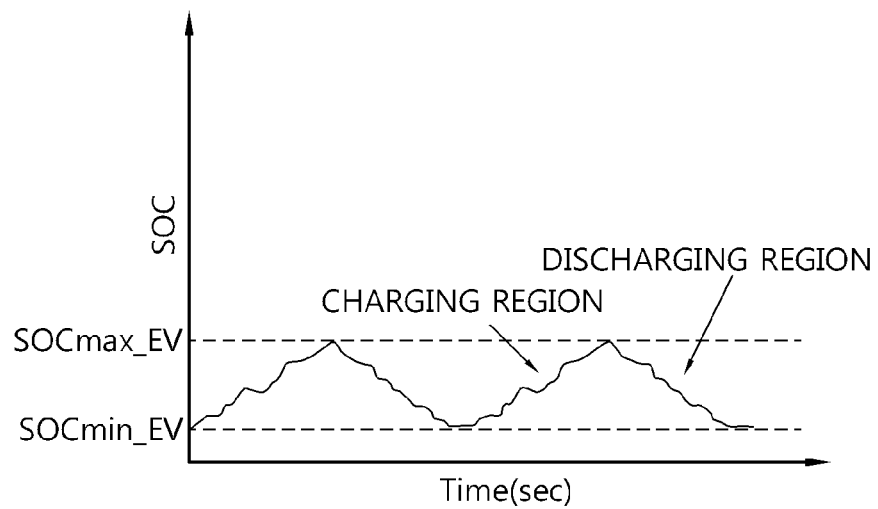
FIG. 7 is a graph showing a change of a SOC of a secondary battery in a HEV mode of FIG. 5.

FIG. 5 is a diagram exemplarily showing how to apply a HEV mode in a low SOC region, FIG. 6 is a graph showing a change of the SOC of the secondary battery in an EV mode of FIG. 5, and FIG. 7 is a graph showing a change of the SOC of the secondary battery in a HEV mode of FIG. 5.

Referring to FIGS. 5 to 7, an electric vehicle supporting the HEV mode runs in an EV mode in a region ($SOC_{min\_EV}$~$SOC_{max\_EV}$) where the SOC of the secondary battery is high. In the EV mode, the vehicle is driven using electric energy of the secondary battery, and thus the SOC of the secondary battery slowly decreases from $SOC_{nax\_EV}$ to $SOC_{min\_EV}$ as shown in FIG. 6. If the SOC reaches $SOC_{min\_EV}$, a desired power is not obtained just with the secondary battery, and thus the HEV mode is applied from this point.

If the HEV mode is initiated, the electric vehicle runs by the engine. At this time, the secondary battery is charged by means of a power generator connected to the engine. Therefore, the SOC of the secondary battery starts increasing. In addition, if the secondary battery is continuously charged so that the SOC reaches $SOC_{max\_HEV}$, the secondary battery may be used again. Therefore, the engine stops, and the secondary battery starts being discharged. If so, the SOC of the secondary battery starts decreasing again, and if the SOC decreases to $SOC_{min\_HEV}$, the secondary battery is not used again and the engine is used. This process repeats while the HEV mode is maintained, and thus the SOC of the secondary battery periodically changes in the range of $SOC_{min\_HEV}$ to $SOC_{max\_HEV}$ as shown in FIG. 7. For reference, the SOC region depicted with slashes in FIG. 5 is a SOC region which is not used for preventing overcharging or overdischarging of the secondary battery.

As described above, in the HEV mode, the secondary battery is charged and discharged repeatedly. However, if the secondary battery used in the electric vehicle contains a blended cathode material, the SOC region to which the HEV mode is applied may unfortunately belong to a transition region of the blended cathode material. In the transition region, the SOC of the secondary battery may not be accurately estimated as described above. Therefore, if the SOC is estimated by using the dynamic voltage while the HEV mode is applied in the transition region so that the secondary battery repeats charging and discharging, SOC errors are accumulated as time goes, thereby gradually deteriorating the accuracy of the estimated SOC. As a result, a time point for shifting a power means from the engine to the secondary battery or vice versa, which is the most important control element of the HEV mode, may not be suitably controlled.

Figure 8:
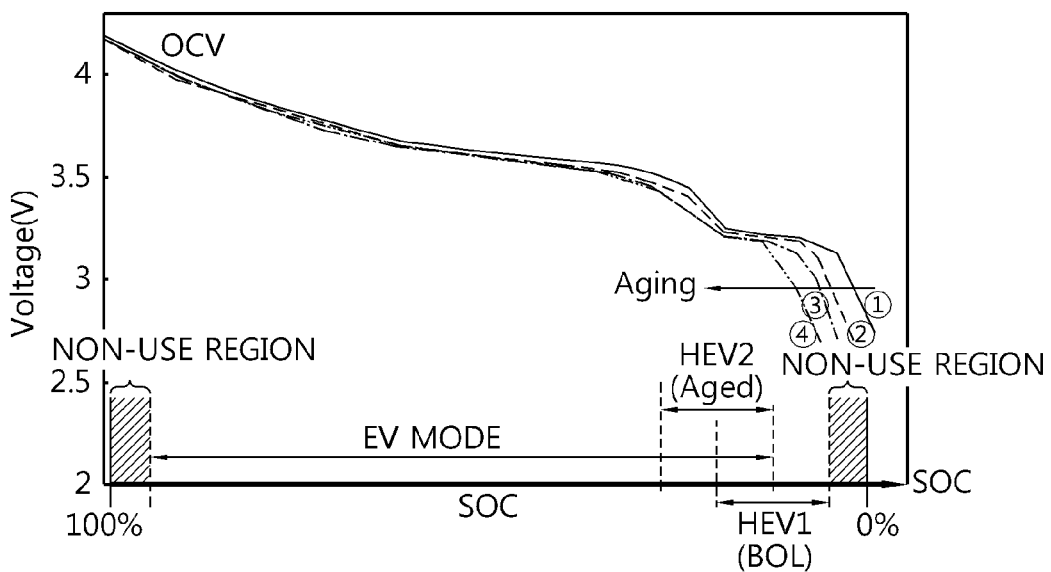
FIG. 8 is a graph showing open-circuit voltage profiles of four lithium secondary batteries containing a blended cathode material in which NMC cathode material and LFP cathode material are blended at a ratio of 7:3 (a weight ratio) in a cathode and having different charge/discharge cycles (namely, different degrees of aging) according to SOCs, whereby SOC regions in which an EV mode and a HEV mode are applied are represented on a horizontal axis.

FIG. 8 is a graph showing open-circuit voltage profiles of four lithium secondary batteries containing a blended cathode material in which NMC cathode material and LFP cathode material are blended at a ratio of 7:3 (a weight ratio) in a cathode and having different charge/discharge cycles (namely, different degrees of aging) according to SOCs. In FIG. 5, SOC regions in which an EV mode and a HEV mode are applied are indicated in a horizontal axis FIG. 8 depicts four open-circuit voltage profiles (①) to ④)), in which a profile located in a left side represents an open-circuit voltage profile of a lithium secondary battery having more charge/discharge cycles, and a profile (①) at a rightmost location represents an open-circuit voltage profile of a lithium secondary battery in a beginning of life (BOL) state.

As shown in FIG. 8, if the charge/discharge cycle of the lithium secondary battery increases so that the degree of aging increases, the open-circuit voltage profile moves to the left. Therefore, if the battery is aged, the capacity of the battery decreases even though the battery is used in the same open-circuit voltage range.

In addition, since the lithium secondary battery contains a blended cathode material, each open-circuit voltage profile has a SOC region (a dotted rectangular in FIG. 3) where a curvature changes based on the inflection point, and the SOC region corresponds to a transition region where the SOC is not easily estimated.

Two SOC regions HEV1 and HEV2 to which the HEV mode is applied are marked in the horizontal axis of the graph depicted in FIG. 8. Here, the HEV1 region is a region where the HEV mode is applied to a lithium secondary battery in the BOL state. In addition, the HEV2 region is a region where the HEV mode is applied to a lithium secondary battery which exhibits the open-circuit voltage profile ④. The HEV2 region is moved to the left since the capacity of the battery decreases due to the aging effect. The degree of movement of the HEV2 region is proportional to the degree of movement of the open-circuit voltage profile ④. Here, both of the HEV1 and HEV2 regions may be overlapped with the transition region at which the SOC is not easily estimated. In this case, while the HEV mode is being applied in the HEV1 and HEV2 regions, if the SOC of a secondary battery is estimated in a common way, estimation errors of SOC are accumulated, and thus it is substantially impossible to accurately control the HEV mode.

To solve the above problem, the H-EV mode should be applied in the SOC region other than the transition region, and practically, the region where the HEV mode is applied should be moved to an intermediate SOC region. However, in this case, the energy efficiency deteriorates, and thus driving an electric vehicle in the HEV mode is pointless.

In addition, since a technique of running an electric vehicle at an economical speed or forcibly applying the HEV mode at any time according to a choice of a driver is recently used, it is impossible to entirely discount a possibility that the SOC region where the HEV mode is applied is overlapped with the transition region. Therefore, in order to apply a lithium secondary battery containing a blended cathode material to an electric vehicle, it is necessary to accurately estimate the SOC of a battery in the HEV mode region.

Inventors of this application have verified that when a secondary battery containing a blended cathode material is charged in a transition region of the secondary battery, the dynamic voltage of the secondary battery exhibits a voltage variation pattern having an inflection point, and the voltage variation pattern changes according to SOC. In addition, the inventors of this application have also verified that a 1:1 relationship may be established between a parameter capable of identifying the voltage variation pattern and the SOC.

Figure 9:
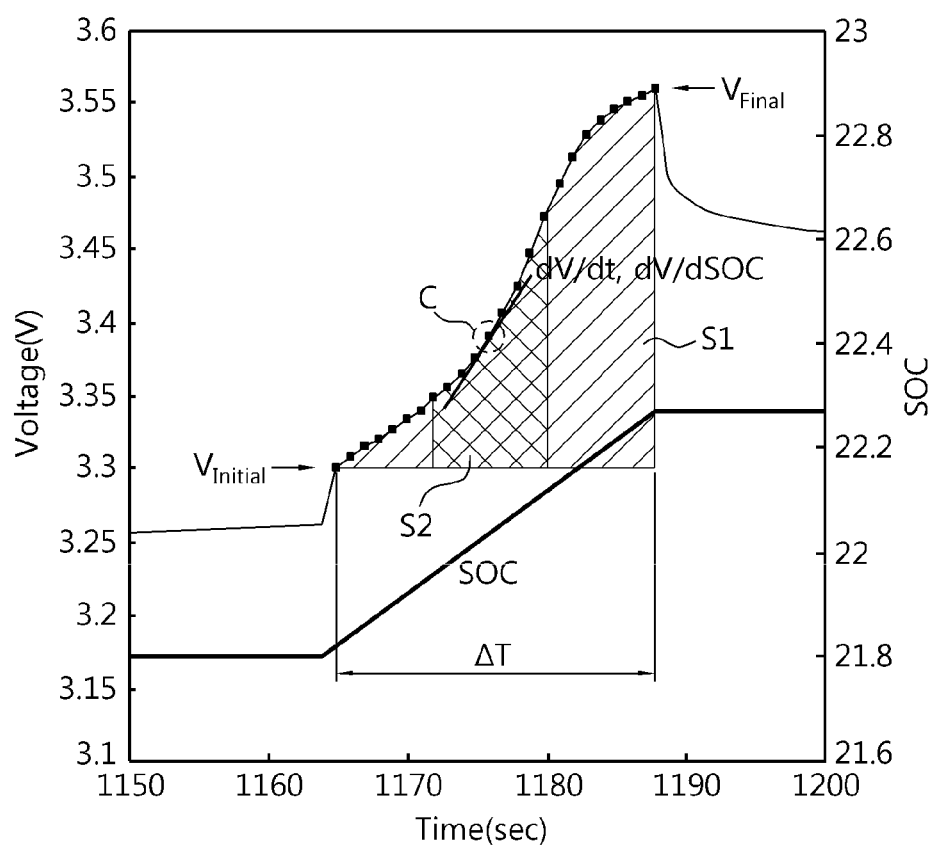
FIG. 9 is a graph showing changes of a dynamic voltage and a SOC of a battery when pulse charging is applied in a transition region to a lithium secondary battery containing a blended cathode material in which NMC cathode material and LFP cathode material are blended at a ratio of 7:3 (a weight ratio) in a cathode.

FIG. 9 is a graph showing changes of a dynamic voltage and a SOC of a battery when pulse charging is applied in a transition region to a lithium secondary battery containing a blended cathode material in which NMC cathode material and LFP cathode material are blended at a ratio of 7:3 (a weight ratio) in a cathode.

Referring to FIG. 9, while pulse charging is being performed, the SOC increases linearly. In addition, the profile of the dynamic voltage has an inflection point, and a curvature changes from a concave shape to a convex shape before and after the inflection point. Therefore, dV/dt has a maximum value at the inflection point, dV/dt tends to gradually increase to the maximum value before the inflection point, and dV/dt tends to gradually decrease from the maximum value after the inflection point. Hereinafter, the dynamic voltage pattern having an inflection point and also having a curvature conversion before and after the inflection point will be called a transition region voltage pattern.

The shape of the transition region voltage pattern may be inherently specified by using at least one parameter. In other words, the transition region voltage pattern may be specified by at least one parameter selected from the group consisting of an initial charge voltage ($V_{initial}$) at which a voltage starts increasing, a final charge voltage ($V_{final}$) at which a voltage ends increasing, a time ($\tau$) taken until an inflection point occurs from a point when a voltage starts increasing, dV/dt at the inflection point, dV/dSOC (dSOC is obtained by calculating a capacity variation of a secondary battery per unit time by means ampere counting) at the inflection point, a time ($\Delta T$) taken for the dynamic voltage of the secondary battery to change from the initial charge voltage to the final charge voltage, an integral value (S1) of the entire identified transition region voltage pattern, and an integral value (S2) obtained by integrating the transition region voltage pattern in a predetermined time range before or after the inflection point.

The parameter varies according to the SOC of a secondary battery. Therefore, if the transition region voltage pattern is detected while the secondary battery is being pulse charged, the SOC of the secondary battery may be estimated by calculating the parameter with respect to the detected transition region voltage pattern. For example, the SOC may be estimated by calculating the time ($\tau$) taken until an inflection point occurs from a point when a voltage starts increasing in the transition region voltage pattern and dV/dt at the inflection point. In order to estimate the SOC of a secondary battery by using a parameter calculated from the transition region voltage pattern, a predetermined relationship between the parameter and the SOC is required.

The predetermined relationship may be a look-up table or a look-up function, without being limited thereto. The look-up table or the look-up function may be obtained through experiments. In other words, experiment conditions for accurately measuring a SOC of a secondary battery and allowing pulse charging are prepared. After that, an open-circuit voltage profile is obtained while performing pulse charging to the secondary battery, and a SOC region where a curvature changes is found in the open-circuit voltage profile to identify the transition region. After that, pulse charging is applied to the secondary battery from a lower limit of the transition region to an upper limit thereof to increase the SOC little by little. The pulse charging is performed under the same condition as the pulse charging applied in the HEV mode. In other words, a current intensity of charging pulses and an applying time of charging pulses are set identically to those applied in the HEV mode. If pulse charging is completely once, a predetermined break is given. When each pulse charging is applied, the transition region voltage pattern is measured, and SOC before and after the pulse charging is accurately measured. After that, at least one parameter is calculated for every transition region voltage pattern to collect data required for generating the look-up table or the look-up function. After that, by using the collected data, a look-up table is generated so as to have a data structure which may allow SOC (SOC before pulse charging or SOC after pulse charging) to be referred to from at least one parameter. In other case, by using the collected data, a look-up function using at least one parameter as an input variable and also using SOC (SOC before pulse charging or SOC after pulse charging) as an output variable is derived by means of numerical analysis. The look-up table or the look-up function may also be generated according to intensity of pulse charging current. This is because if the intensity of the pulse charging current changes, the transition region voltage pattern also changes.

The look-up table or the look-up function obtained as above may be used for accurately estimating the SOC of a secondary battery containing a blended cathode material in a transition region. Therefore, hereinafter, an apparatus and method for estimating an SOC of a secondary battery containing a blended cathode material by using the look-up table or the look-up function will be described in more detail.

Figure 10:
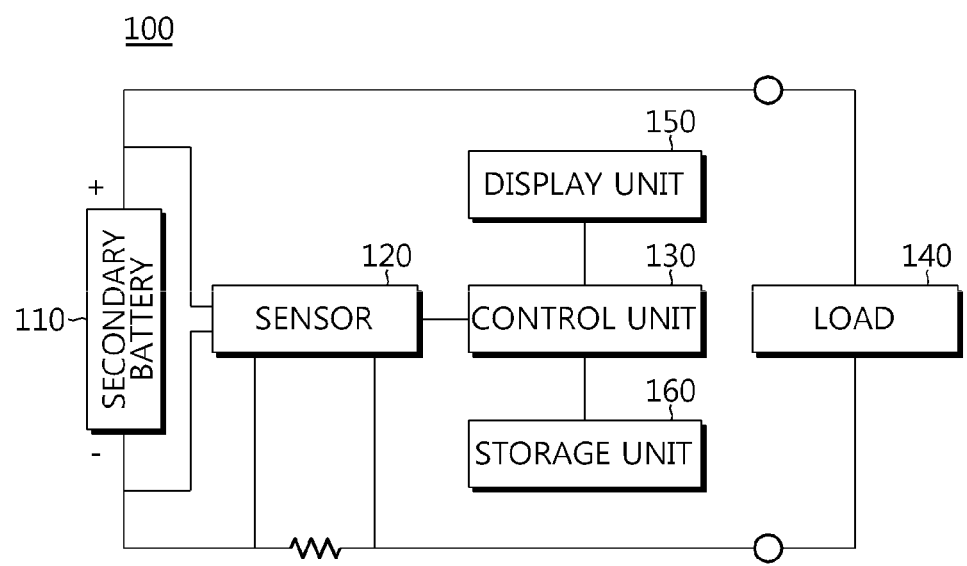
FIG. 10 is a block diagram schematically showing a SOC estimating apparatus of a secondary battery having a blended cathode material according to an embodiment of the present disclosure.

FIG. 10 is a block diagram schematically showing a SOC estimating apparatus of a secondary battery including a blended cathode material according to an embodiment of the present disclosure.

As shown in FIG. 10, the SOC estimating apparatus 100 includes a sensor 120 and a control unit 130 and is electrically connected to the secondary battery 110 including a blended cathode material to estimate a SOC in a transition region of the secondary battery 110.

The SOC estimating apparatus 100 is electrically connected to a load 140. The load 140 may be included in various kinds of electric-driven apparatuses and means an energy-consuming device included in an electric-driven apparatus operated with the electric energy supplied when the secondary battery 110 is discharged. The load may be a rotation-driving device such as a motor, a power-converting device such as an inverter, or the like, but the present disclosure is not limited to specific kinds of loads.

The SOC estimating apparatus 100 may further include a storage unit 160, selectively. The storage unit 160 stores a look-up table or a look-up function obtained in advance through experiments. The look-up table and the look-up function are described above and will not be described in detail here. The look-up table and the look-up function may be stored in the storage unit 160 as binary data or a part of program codes.

The storage unit 160 is not specially limited if it may serve as a storage medium capable of recording and erasing information. For example, the storage unit 160 may be RAM, ROM, register, hard disk, optical recording medium or magnetic recording medium. The storage unit 160 may be connected to the control unit 130 so as to be accessed by the control unit 130 through, for example, a data bus or the like. The storage unit 160 store and/or update and/or erase and/or transmit program having various control logics executed by the control unit 130 and/or data generated when the control logics are executed. The storage unit 160 may be divided into two or more logic units and may also be included in the control unit 130, without any restriction.

The SOC estimating apparatus 100 may further include a display unit 150, selectively. The display unit 150 is not specially limited as long as it may display a SOC of the secondary battery 110 calculated by the control unit 130 as a graphic interface. Here, the graphic interface means an interface displaying a SOC directly with digits or as a relative level by using graphic elements such as a bar graph. For example, the display unit 150 may be a liquid crystal display, an LED display, an OLED display, an E-INK display, a flexible display or the like. The display unit 150 may be connected to the control unit 130 directly or indirectly. When indirect connection is adopted, the display unit 150 may be located in an area physically separated from the area where the control unit 130 is located. In addition, a third control unit (not shown) may be interposed between the display unit 150 and the control unit 130 to receive information, which will be displayed on the display unit 150 by the third control unit, from the control unit 130 and display the information on display unit 150. For this, the third control unit and the control unit 130 may be connected through a communication line.

The sensor 120 repeatedly measures a dynamic voltage of the secondary battery 110 at time intervals while the secondary battery 110 is being charged for a predetermined time and provides the measured dynamic voltage to the control unit 130. The predetermined time may be, for example, several microseconds or several ten seconds. When the secondary battery 110 is a secondary battery used for an electric vehicle, the charging may be pulse charging. Here, the pulse charging means charging at which a constant current is intermittently applied as a charge current. When the secondary battery 110 is used in an electric vehicle which supports the HEV mode, the charging may be charging performed in the HEV mode. However, the present disclosure is not limited to the kind of charging or the kind of device to which the secondary battery 110 is applied. The sensor 120 may optionally measures a current of the secondary battery 110 repeatedly at time intervals while the secondary battery 110 is being charged and provides the current information of the measured current of the secondary battery 110 to the control unit 130, and the control unit 130 may calculate a variation of the SOC by means of ampere counting while the charging is being performed.

The control unit 130 executes at least one control logic required for estimating the SOC of the secondary battery 110.

The control logic may include at least a logic for storing the dynamic voltage of the secondary battery 110 measured by the sensor 120 in the storage unit 160. The dynamic voltage is repeatedly measured at time intervals while the secondary battery 110 is being charged. Therefore, a plurality of voltage data stored in the storage unit 160 may configure a dynamic voltage profile.

The control logic may optionally include a logic for storing the current of the secondary battery 110 measured by the sensor 120 in the storage unit 160. The current may be repeatedly measured at time intervals while the secondary battery 110 is being charged. Therefore, a plurality of current data stored in the storage unit 160 may configure a current profile.

The control logic may include a logic for identifying the dynamic voltage profile stored in the storage unit 160 as a transition region voltage pattern. This identification may be performed by determining whether an inflection point is present in the dynamic voltage profile, whether the dynamic voltage profile has a curvature conversion, or whether a first-order differential value of the dynamic voltage profile has a maximum value.

The control logic also includes a logic for calculating a parameter with respect to the identified transition region voltage pattern. The parameter includes at least one parameter selected from the group consisting of an initial charge voltage ($V_{initial}$) at which a voltage starts increasing, a final charge voltage ($V_{final}$) at which a voltage ends increasing, a time ($\tau$) taken until an inflection point occurs from a point when a voltage starts increasing, dV/dt at the inflection point, dV/dSOC (dSOC is obtained by calculating a capacity variation of a secondary battery per unit time by means ampere counting) at the inflection point, a time ($\Delta T$) taken for the dynamic voltage of the secondary battery to change from the initial charge voltage to the final charge voltage, an integral value (S1) of the entire identified transition region voltage pattern, and an integral value (S2) obtained by integrating the transition region voltage pattern in a predetermined time range before or after the inflection point.

The control logic also includes a logic for estimating a SOC of a secondary battery corresponding to the parameter calculated from the identified transition region voltage pattern by using the look-up table or the look-up function stored in the storage unit 160.

When the look-up table or the look-up function varies depending on intensity of a charge current, the control logic may further include a logic for selecting the look-up table or the look-up function used for estimating SOC according to intensity of the charge current.

If a data structure by which SOC may be mapped by using both the intensity of charge current and the parameter is included in the look-up table or intensity of charge current is included in the look-up function as an input variable, the selection logic may be excluded.

The control logic may include a logic for estimating SOC by mapping SOC corresponding to the calculated parameter from the look-up table. In addition, the control logic may include a logic for estimating SOC by putting the calculated parameter as an input variable of the look-up function and obtaining SOC as an output variable.

The estimated SOC may be SOC before charging starts or after charging ends. If the estimated SOC is SOC before charging starts, the control logic may include a logic for estimating SOC after charging ends by obtaining a variation of SOC by performing ampere counting as to the current profile stored in the storage unit 160 while the secondary battery 110 is being charged.

The control logic may further include a logic for storing the estimated SOC in the storage unit 160 and/or a logic for outputting the estimated SOC through the display unit 150 and/or a logic for outputting the estimated SOC to another external control device. Another control device may be a central computing device for electronically controlling components loaded on a vehicle, for example an engine, when the secondary battery 110 is used for an electric vehicle.

When the secondary battery 110 is loaded on an electric vehicle which supports the 1EV mode, if the electric vehicle operates in the HEV mode, charge and discharge cycles of the secondary battery 110 may repeat. In this case, the control unit 130 may estimate the SOC of the secondary battery 110 in each charge cycle by using the control logic. In addition, when pulse charging repeats in each charge cycle, the control unit 130 may estimate the SOC of the secondary battery by using the control logic whenever the pulse charging repeats. In addition, while each pulse charging is being performed, the control unit 130 may estimate the SOC of the secondary battery only when a condition where the dynamic voltage profile is identified as the transition region voltage pattern is established.

The control unit 130 may estimate the SOC of the secondary battery by executing the above control logic regardless of the driving mode of the electric vehicle if the dynamic voltage profile measured while the secondary battery is being charged is identified as the transition region voltage pattern.

Meanwhile, in a modification of the present disclosure, the control unit 130 may calculate an inflection point identifier from the dynamic voltage measured by the sensor 120, determine a parameter corresponding to a transition region voltage pattern when the inflection point identifier satisfies a condition under which an inflection point occurs (or, an inflection point occurrence condition), and estimate a SOC of the secondary battery from the calculated parameter by using a predetermined relationship between the parameter and the SOC of the secondary battery.

Preferably, the inflection point identifier may be updated whenever a dynamic voltage is measured by the sensor 120.

In the present disclosure, the inflection point identifier is used for determining in real time whether the dynamic voltage measured by the sensor 120 forms an inflection point as time goes.

For example, the inflection point identifier may be a first-order differential value (dV/dt) of the dynamic voltage with respect to a measurement time of the dynamic voltage. In this case, the inflection point occurrence condition is a condition that the first-order differential value of the dynamic voltage has a maximum value.

As another example, the inflection point identifier may be a secondary differential value ($d^2V/d^2t$) of the dynamic voltage with respect to a measurement time of the dynamic voltage. In this case, the inflection point occurrence condition is a condition that the secondary differential value of the dynamic voltage becomes 0.

As another example, the inflection point identifier may be a first-order differential value (dV/dSOC) of the dynamic voltage with respect to the SOC of the secondary battery. In this case, the inflection point occurrence condition is a condition that the first-order differential value of the dynamic voltage has a maximum value.

As described above, in an embodiment where the inflection point identifier is utilized, the control unit 130 may determine at least one selected from the group consisting of an initial charge voltage ($V_{initial}$), a final charge voltage ($V_{initial}$), a time ($\tau$) taken until the inflection point occurrence condition is satisfied, dV/dt (V=dynamic voltage) when the inflection point occurrence condition is satisfied, dV/dSOC (V=dynamic voltage, SOC=SOC) when the inflection point occurrence condition is satisfied, a time ($\Delta T$) taken for the dynamic voltage of the secondary battery to change from the initial charge voltage to the final charge voltage, a voltage integral value from the initial charge voltage to the final charge voltage, and an integral value of the measured dynamic voltage in a predetermined time range when the inflection point occurrence condition is satisfied, as a parameter corresponding to the transition region voltage pattern In an embodiment in which the inflection point identifier is utilized, the control unit 130 may estimate a SOC of the secondary battery from the determined parameter by using the look-up table in which a relationship between the parameter and the SOC is defined.

As an alternative, the control unit 130 may estimate a SOC of the secondary battery from the determined parameter by using the look-up function in which the parameter is an input variable and the SOC is an output variable.

When the control unit 130 estimates a SOC of the secondary battery by using the look-up table or the look-up function, the above description may be applied identically.

The control unit 130 may selectively include processors well known in the art, ASIC (application-specific integrated circuit), other chipsets, logic circuits, registers, communication modems, data processing devices or the like in order to execute various control logics described below. In addition, when the control logic is implemented as software, the control unit 130 may be implemented as an aggregate of program modules. At this time, program modules may be stored in a memory and executed by processors. The memory may be present in or out of the processor and may be connected to the processor by various means. In addition, the memory may be included in the storage unit 160 of the present disclosure. Moreover, the memory is a general name to call devices storing information, regardless of the kind of devices, without being limited to a specific memory device.

In addition, at least one of various control logics of the control unit 130 may be combined, and the combined control logics may be composed in computer-readable program codes and recorded in a computer-readable recording medium. The recording medium is not specially limited if it may be accessed by a processor included in a computer. For example, the recording medium includes at least one selected from the group consisting of ROM, RAM, register, CD-ROM, magnetic tape, hard disk, floppy disk and optical data storage. In addition the code system may be modulated into carrier signals and included in a communication carrier at a specific time and also be distributed to, stored in and executed by computers connected by a network. In addition, functional programs, codes and code segments for implementing the combined control logics may be easily inferred by programmers in the art.

Hereinafter, a method for estimating SOC of a secondary battery containing a blended cathode material by using the above apparatus will be described in detail.

Figure 11:
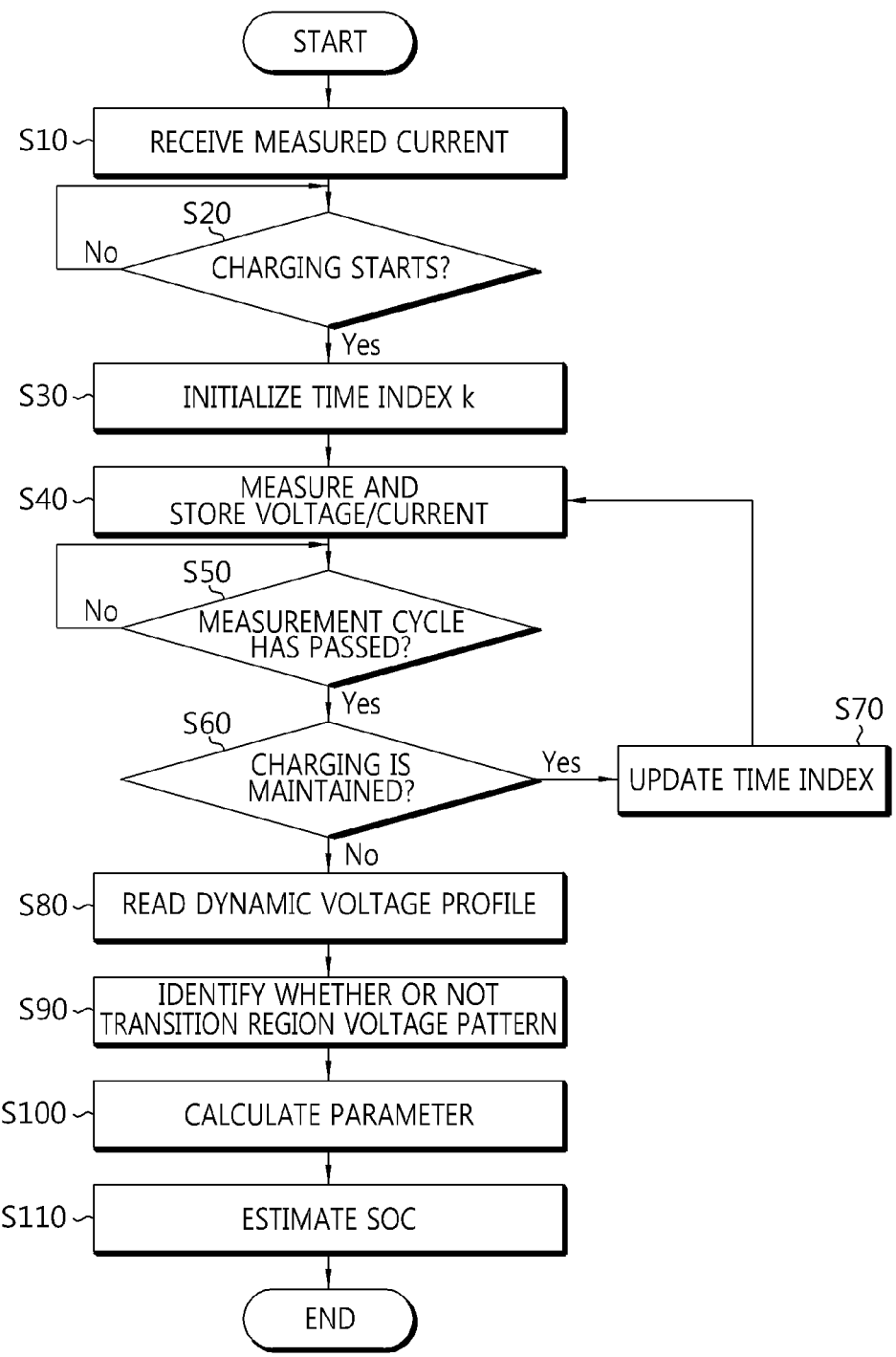
FIG. 11 is a flowchart for illustrating a method for estimating a SOC of a secondary battery having a blended cathode material according to an embodiment of the present disclosure.

FIG. 11 is a flowchart for illustrating a method for estimating a SOC of a secondary battery having a blended cathode material according to an embodiment of the present disclosure.

Referring to FIGS. 10 and 11 together, the control unit 130 measures a current of the secondary battery 110 at time intervals by using the sensor 120 (S10).

Subsequently, the control unit 130 determines with reference to intensity and sign of the current of the secondary battery 110 whether charging starts (S20). For reference, if the secondary battery 110 is charged, the current has a negative sign, and if the secondary battery 110 is discharged, the current has a positive sign.

If it is determined that charging starts, the control unit 130 initiates a time index in order to repeatedly measure a dynamic voltage, and optionally a current, of the secondary battery 110 (S30).

Subsequently, the control unit 130 measures a dynamic voltage, and optionally a current, of the secondary battery 110 and stores in the storage unit 160 (S40).

Next, the control unit 130 determines whether a measurement cycle has passed (S50). Here, the measurement cycle means a time period by which a dynamic voltage, and optionally a current, is measured repeatedly.

If it is determined that the measurement cycle has passed, the control unit 130 measures a current of the secondary battery 110 by using the sensor 120 to determine whether charging is still maintained.

If it is determined that charging is maintained, the control unit 130 updates the time index (S70). After that, the control unit 130 proceeds to Step S40 to repeat a control logic for measuring a dynamic voltage, and optionally a current, of the secondary battery 110 by using the sensor 120 and storing in the storage unit 160. Therefore, whenever a measurement cycle passes while charging is maintained, the control unit 130 repeats a control logic for measuring a dynamic voltage, and optionally a current, of the secondary battery 110 and storing in the storage unit 160.

Meanwhile, if it is determined in Step S60 that charging is completed, the control unit 130 executes a control logic for estimating a SOC of the secondary battery 110 by using the dynamic voltage profile stored in the storage unit 160.

First, the control unit 130 reads the dynamic voltage profile stored in the storage unit 160 (S80). After that, the control unit 130 identifies whether the dynamic voltage profile corresponds to a transition region voltage pattern (S90).

This identification may be performed by determining whether an inflection point is present in the dynamic voltage profile, whether the dynamic voltage profile has different curvature, or whether a first-order differential value of the dynamic voltage profile has a maximum value.

If the dynamic voltage profile is identified as a transition region voltage pattern, the control unit 130 calculates a parameter with respect to the identified transition region voltage pattern (S100).

The parameter includes at least one parameter selected from the group consisting of an initial charge voltage ($V_{initial}$) at which a voltage starts increasing, a final charge voltage ($V_{final}$) at which a voltage ends increasing, a time ($\tau$) taken until an inflection point occurs from a point when a voltage starts increasing, dV/dt at the inflection point, dV/dSOC (dSOC is obtained by calculating a capacity variation of a secondary battery per unit time by means ampere counting) at the inflection point, a time ($\Delta T$) taken for the dynamic voltage of the secondary battery to change from the initial charge voltage to the final charge voltage, an integral value (S1) of the entire identified transition region voltage pattern, and an integral value (S2) obtained by integrating the transition region voltage pattern in a predetermined time range before or after the inflection point.

Subsequently, the control unit 130 estimates a SOC of a secondary battery corresponding to the calculated parameter by using the look-up table or the look-up function stored in the storage unit 160 (S110).

When the look-up table or the look-up function varies depending on intensity of a charge current, the control unit 130 may further execute a logic for selecting the look-up table or the look-up function used for estimating SOC according to intensity of the charge current.

If a data structure by which SOC may be mapped by using both the intensity of charge current and the parameter is included in the look-up table or the intensity of charge current is included in the look-up function as an input variable, the selection logic may be excluded.

When using the look-up table, the control unit 130 may execute a logic for estimating SOC by mapping SOC corresponding to the calculated parameter from the look-up table.

For example, the control unit 130 may estimate a SOC of the secondary battery 110 by calculating the time ($\tau$) taken until an inflection point occurs from a point when a voltage starts increasing in the identified transition region voltage pattern and dV/dt at the inflection point, and mapping SOC corresponding to two values calculated from the look-up table.

When using the look-up function, the control unit 130 may estimate a SOC by putting the calculated parameter as an input variable of the look-up function and obtaining SOC as an output variable.

For example, the control unit 130 may estimate a SOC of the secondary battery 110 by calculating the time ($\tau$) taken until an inflection point occurs from a point when a voltage starts increasing in the identified transition region voltage pattern and dV/dt at the inflection point, and putting two calculated values as input variables of the look-up function and obtaining SOC as an output variable.

The estimated SOC is SOC before charging starts or after charging ends. If the estimated SOC is SOC before charging starts, the control unit 130 may estimate SOC after charging ends by obtaining a variation of SOC by integrating the current profile stored in the storage unit 160 while the secondary battery 110 is being charged.

Though not shown in the figures, the control unit 130 may further execute a logic for storing the estimated SOC in the storage unit 160 and/or a logic for outputting the estimated SOC through the display unit 150 as a graphic interface and/or a logic for outputting the estimated SOC to another external controller.

Meanwhile, if the method of the present disclosure is used for estimating a SOC of a secondary battery loaded in an electric vehicle which supports the HEV mode, the control unit 130 may execute a control logic for estimating SOC when the HEV mode is initiated. The control unit 130 may also execute the above control logic regardless of the HEV mode. The control unit 130 may receive initiation information of the HEV mode from a central computer of the electric vehicle. The HEV mode may be automatically executed in a preset SOC range, automatically executed when an electric vehicle runs at an economical speed with good engine efficiency, or forcibly executed by a driver of the electric vehicle.

The SOC estimating method of the present disclosure may be desirably applied when the secondary battery is charged by means of pulse charging in a HEV mode. In other words, after the HEV mode starts, when the secondary battery is subject to pulse charging first, the control unit 130 may estimate a SOC of the secondary battery in a first pulse charging cycle by using the above control logic. This estimation may also be performed after the first pulse charging cycle. In other words, whenever pulse charging repeats, the above control logic may be repeatedly executed to estimate SOC. The control unit 130 may update the latest estimated SOC of the secondary battery into a newly estimated SOC. The latest estimated SOC of the secondary battery is stored in the storage unit 160.

If the SOC is updated as described above, errors accumulated while repeatedly calculating SOCs before the SOC is updated are entirely removed. In addition, in the HEV mode, charging and discharging are repeated at time intervals. Here, if the SOC of the secondary battery at every time when a new charging cycle is performed, even though charging and discharging of the secondary are repeated in the transition region, accumulation of SOC errors may be solved.

Meanwhile, when estimating a SOC of the secondary battery, the control unit 130 may apply a modified method as follows.

In other words, the control unit 130 may calculate an inflection point identifier whenever a dynamic voltage is measured by the sensor 120, determine a parameter corresponding to a transition region voltage pattern when the inflection point identifier satisfies an inflection point occurrence condition, and estimate a SOC of the secondary battery from the calculated parameter by using a predetermined relationship between the parameter and the SOC of the secondary battery.

Here, parameters corresponding to the inflection point identifier, the inflection point occurrence condition and the transition region voltage pattern and the relationship between the parameter and the SOC are described above, and they are not described in detail here.

In this embodiment, while the secondary battery is being charged, a SOC region where the transition region voltage pattern is formed, namely the transition region, may be moved to the left according to the degree of capacity degradation of the secondary battery. The capacity degradation of the secondary battery may be defined as a relative ratio of current capacity in comparison to a capacity of the secondary battery in a BOL state, and the degree of capacity degradation may be determined by using a method commonly used in the art. The degree of capacity degradation of the secondary battery may be calculated by estimating an internal resistance of the secondary battery or quantitatively evaluating how much the open-circuit voltage profile of the secondary battery is moved to the left based on the open-circuit voltage profile measured in a BOL state, without being limited thereto. However, the present disclosure is not limited to the method for determining capacity degradation of a secondary battery.

In the present disclosure, the secondary battery may include a cathode containing a blended cathode material, an anode containing an anode material anode and a separator.

In an embodiment, the cathode may include a thin-plate metallic current collector made of conductive material, and a cathode material coating layer containing the blended cathode material and formed on at least one surface of the metallic current collector.

The metallic current collector is made of material with chemical stability and high conductivity. For example, the metallic current collector may be made of aluminum, stainless steel, nickel, titanium, sintered carbon or the like. As another example, the metallic current collector may be made of aluminum or stainless steel coated with carbon, nickel, titanium, silver or the like on the surface thereof.

The cathode material coating layer may further include additives such as a conducting agent and a binder in addition to the blended cathode material.

The conducting agent is not specially limited if it may improve electric conductivity of the blended cathode material, and may use various conductive carbonaceous materials such as graphite, carbon black, acetylene black, Ketjen black, Super-P, carbon nano tube or the like, without being limited thereto.

The binder is not specially limited if it allows a close physical joint among particles of the blended cathode material and a close interfacial joint between the blended cathode material and the metallic current collector. Various kinds of polymers such as poly(vinylidene fluoride-co-hexafluoropropylene polymer) (PVDF-co-HFP), polyvinylidene fluoride, polyacrylonitrile, polymethyl methacrylate or the like may be used as the binder, without being limited thereto.

In an embodiment, the anode may include a thin-plate metallic current collector made of conductive material, and an anode material coating layer containing anode material and formed on at least one surface of the metallic current collector.

The metallic current collector is made of material with chemical stability and high conductivity. For example, the metallic current collector may be made of copper, aluminum, stainless steel, nickel, titanium, sintered carbon or the like. As another example, the metallic current collector may be made of copper or stainless steel coated with carbon, nickel, titanium, silver or the like on the surface thereof or an aluminum-cadmium alloy.

The anode material is not specially limited if it has a different oxidation/reduction potential (redox potential) from the blended cathode material and allows intercalation of operating ions during the charging process and deintercalation of operating ions during the discharging process.

The anode material may use carbonaceous material, lithium metal, silicon, tin or the like, without being limited thereto, and may also use metal oxides such as $TiO_2$ and $SnO_2$ with a potential lower than 2V. Preferably, the anode material may use carbonaceous material, and the carbonaceous material may use both low crystalline carbon and high crystalline carbon. The low crystalline carbon representatively includes soft carbon and hard carbon, and the high crystalline carbon representatively includes high-temperature sintered carbon such as natural graphite, Kish graphite, pyrolytic carbon, mesophase pitch based carbon fiber, mesocarbon microbeads, mesophase pitches, petroleum derived cokes, and tar pitch derived cokes.

The anode material coating layer may further include additives such as a conducting agent and a binder in addition to the anode material. The conducting agent and the binder may use materials which are available as a conducting agent and a binder included in a cathode material coating layer.

The separator is not specially limited if it has a pore structure for electrically separating the cathode and the anode and allowing the transfer of operating ions.

In an embodiment, the separator may use a porous polymer film, for example a porous polymer film made from polyolefin-based polymer such as ethylene homopolymer, propylene homopolymer, ethylene/butene copolymer, ethylene/hexene copolymer, and ethylene/methacrylate copolymer, or their laminates. As other examples, a common porous non-woven fabric made from, for example, high-melting glass fibers or polyethylene terephthalate fibers may be used.

Meanwhile, at least one surface of the separator may include a coating layer of inorganic particles. In addition, the separator may be made of a coating layer of inorganic particles. The particles of the coating layer may have a structure coupled with a binder so that interstitial volumes are present among adjacent particles. This structure is disclosed in PCT International Publication WO 2006/025662, which may be incorporated herein by reference. The inorganic particles may be made of inorganic material with a dielectric constant of 5 or above. The inorganic materials may include at least one selected from the group consisting of $Pb(Zr,Ti)O_3$ (PZT), $Pb_{1-x}La_xZr_{1-y}Ti_yO_3$ (PLZT), PB $(Mg_3Nb_{2/3})O_3$—$PbTiO_3$ (PMN-PT), $BaTiO_3$, hafnia ($HfO_2$), $SrTiO_3$, $TiO_2$, $Al_2O_3$, $ZrO_2$, $SnO_2$, $CeO_2$, MgO, CaO, ZnO and $Y_2O_3$, without being limited thereto.

The secondary battery may also further include an electrolyte containing operating ions. The electrolyte is not specially limited if it may include operating ions and cause an electrochemical oxidation or reduction reaction at the cathode and the anode by means of the operating ions.

The electrolyte may be a salt having a structure of $A^+B^-$, without being limited thereto. Here, the $A^+$ includes alkali metallic cations such as $Li^+$, $Na^+$, and $K^+$ or their combinations. In addition, $B^-$ includes at least one anion selected from the group consisting of $F^-$, $CF^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$.

The electrolyte may also be used in a state of being dissolved in an organic solvent. The organic solvent may use propylene carbonate (PC), ethylene carbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone, or their mixtures.

In an embodiment, the secondary battery may further include a package for sealing the cathode, the anode and the separator. In the case the cathode, the anode and the separator are sealed by the package, the cathode and the anode may be respectively jointed to a cathode terminal and an anode terminal, and the cathode terminal and the anode terminal may be led out of the package. On occasions, in the case the package serves as an electrode terminal, either the cathode terminal or the anode terminal may be replaced with the package. For example, if the anode is electrically connected to the inside of the package, the outer surface of the package may function as an anode. The package is not specially limited if it has chemical stability and may be made of metal, polymer, a flexible pouch film or the like, without being limited thereto. The flexible pouch film may be representatively an aluminum pouch film where a thermal bonding layer, an aluminum layer and an outer protection layer are laminated.

The appearance of the secondary battery is determined by the structure of the package. The package may adopt any structure used in the art and its appearance according to the use of a battery is not specially limited. The package may have structures such as a cylindrical shape, a rectangular shape, a pouch shape or a coin shape without being limited thereto.

The secondary battery includes an electrode assembly in which unit cells, each having at least a laminated structure of cathode/separator/anode, are assembled. The unit cell may have various structures known in the art. For example, the unit cell may have a bi-cell structure where outermost electrodes have the same polarity or a full-cell structure where outermost electrodes have opposite polarities. The bi-cell may have a structure of cathode/separator/anode/separator/cathode, for example. The full-cell may have a structure of, for example, cathode/separator/anode/separator/cathode/separator/anode.

The electrode assembly may have various structures known in the art, and for example the electrode assembly may have a simple stack structure where the unit cell and an insulating film are repeatedly laminated from the bottom to the top. In addition, the electrode assembly may have a stack folding structure formed by disposing unit cells on an insulative folding film at regular intervals and then rolling the insulative folding film together with the unit cells in a predetermined direction. In addition, the electrode assembly may have a jelly roll structure formed by placing a unit cell prepared in a sheet shape extending in one direction on an insulative rolling film and then rolling the unit cell and the insulative rolling film together.

In various embodiments of the present disclosure, components named 'unit' should be understood as functionally distinguishable elements and not physically distinguishable elements. Therefore, each component may be integrated with another component, selectively, or each component may be divided into sub complements for efficient execution of control logic(s). However, even though components are integrated or divided, such integrated or divided components should be interpreted as being within the scope of the present disclosure if their functions are recognized as having substantially the same identity with the present disclosure, as obvious to those skilled in the art.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating a state of charge (SOC) of a secondary battery which includes (i) a cathode comprising a blended cathode material having a first cathode material and a second cathode material having a different chemical formula from the first cathode material, wherein the first and second cathode materials have different operating voltage ranges such that at least one voltage plateau occurs in an open-circuit voltage profile of the secondary battery; (ii) an anode comprising an anode material; and (iii) a separator for separating the cathode from the anode, the apparatus comprising:

a sensor configured to measure a dynamic voltage of the secondary battery during pulse charging of the secondary battery; and a control unit configured to identify a dynamic voltage profile of the secondary battery as a transition region voltage pattern when the dynamic voltage profile has an inflection point, calculate a parameter of the transition region voltage pattern, and estimate a SOC of the secondary battery from the calculated parameter by using a predetermined relationship between the parameter and the SOC, wherein the transition region voltage pattern is respectively generated in advance for a plurality of SOCs belonging from a lower limit to an upper limit of a SOC region corresponding to the at least one voltage plateau where the blended cathode material reacts with operation ions changes and the predetermined relationship establishes a 1:1 relation between the parameter and the SOC for each different transition region voltage pattern, and wherein the first cathode material comprises Li[Ni$_{1/3}$Mn$_{1/3}$Co$_{1/3}$]O$_2$ and the second cathode material comprises LiFePO$_4$.

2. The apparatus for estimating a SOC of the secondary battery according to claim 1, wherein the calculated parameter includes at least one selected from the group consisting of an initial charge voltage (V$_{initial}$) at which a voltage starts increasing in the identified transition region voltage pattern, a final charge voltage (V$_{final}$) at which a voltage ends increasing in the identified transition region voltage pattern, a time (τ) taken until the inflection point occurs from a point when a voltage starts increasing in the identified transition region voltage pattern, dV/dt (V=dynamic voltage) at the inflection point, dV/dSOC (V=dynamic voltage, SOC=SOC) at the inflection point, a time (ΔT) taken for the dynamic voltage of the secondary battery to change from the initial charge voltage to the final charge voltage, an integral value of the entire identified transition region voltage pattern, and an integral value obtained by integrating the transition region voltage pattern in a predetermined time range before or after the inflection point.

3. The apparatus for estimating a SOC of a secondary battery according to claim 1, wherein the predetermined relationship is a look-up table in which a relationship between the parameter and the SOC is defined.

4. The apparatus for estimating a SOC of a secondary battery according to claim 1, wherein the predetermined relationship is a look-up function in which the parameter is an input variable and the SOC is an output variable.

5. The apparatus for estimating a SOC of a secondary battery according to claim 3, further comprising a storage unit in which the look-up table is stored.

6. The apparatus for estimating a SOC of a secondary battery according to claim 4, further comprising a storage unit in which the look-up function is stored.

7. The apparatus for estimating a SOC of a secondary battery according to claim 1, wherein the charging is pulse charging which repeats at time intervals.

8. The apparatus for estimating a SOC of a secondary battery according to claim 7, wherein the control unit estimates a SOC of the secondary battery whenever the pulse charging repeats.

9. The apparatus for estimating a SOC of a secondary battery according to claim 7, wherein during each pulse charging, the control unit estimates a SOC of the secondary battery when the condition of identifying the dynamic voltage profile as the transition region voltage pattern is established.

10. The apparatus for estimating a SOC of a secondary battery according to claim 1, further comprising a display unit for displaying the estimated SOC through a graphic interface,
wherein the control unit outputs the estimated SOC to the display unit.

11. The apparatus for estimating a SOC of a secondary battery according to claim 1, further comprising a storage unit in which the estimated SOC is stored,
wherein the control unit stores the estimated SOC in the storage unit.

12. The apparatus for estimating a SOC of a secondary battery according to claim 1, wherein the control unit outputs the estimated SOC to the outside.

13. The apparatus for estimating a SOC of a secondary battery according to claim 1, wherein the apparatus is configured to be loaded on an electric vehicle supporting a hybrid electric vehicle (HEV) mode, and
wherein the sensor is configured to measure the dynamic voltage of the secondary battery during charging of the secondary battery in the HEV mode.

14. A method for estimating a SOC of a secondary battery implemented by the apparatus according to claim 1, the secondary battery including (a) a cathode comprising a blended cathode material having a first cathode material and a second cathode material having a different chemical formula from the first cathode material, wherein the first and second cathode materials have different operating voltage ranges such that at least one voltage plateau occurs in an open-circuit voltage profile of the secondary battery; (b) an anode comprising an anode material; and (c) a separator for separating the cathode from the anode, the method comprising:
(a) measuring, via the sensor, a dynamic voltage of the secondary battery during charging of the secondary battery;
(b) identifying, via the control unit, a dynamic voltage profile of the secondary battery as a transition region voltage pattern when the dynamic voltage profile has an inflection point;
(c) calculating, via the control unit, a parameter of the identified transition region voltage pattern; and
(d) estimating, via the control unit, a SOC of the secondary battery from the calculated parameter by using a predetermined relationship between the parameter and the SOC,
wherein the transition region voltage pattern is respectively generated in advance for a plurality of SOCs belonging from a lower limit to an upper limit of a SOC region corresponding to the at least one voltage plateau where the blended cathode material reacts with operation ions changes and the predetermined relationship establishes a 1:1 relation between the parameter and the SOC for each different transition region voltage pattern, and
wherein the first cathode material comprises Li[Ni$_{1/3}$Mn$_{1/3}$Co$_{1/3}$]O$_2$ and the second cathode material comprises LiFePO$_4$.

15. The method for estimating a SOC of a secondary battery according to claim 14, wherein in the step (c), the calculated parameter includes at least one selected from the group consisting of an initial charge voltage (V$_{initial}$) at which a voltage starts increasing in the identified transition region voltage pattern, a final charge voltage (V$_{final}$) at which a voltage ends increasing in the identified transition region voltage pattern, a time (τ) taken until the inflection point occurs from a point when a voltage starts increasing in the identified transition region voltage pattern, dV/dt (V=dynamic voltage) at the inflection point, dV/dSOC (V=dynamic voltage, SOC=SOC) at the inflection point, a time (ΔT) taken for the dynamic voltage of the secondary battery to change from the initial charge voltage to the final charge voltage, an integral value of the entire identified transition region voltage pattern, and an integral value obtained by integrating the transition region voltage pattern in a predetermined time range before or after the inflection point.

16. The method for estimating a SOC of a secondary battery according to claim 14, wherein in the step (d), the SOC of the secondary battery is estimated by using a look-up table in which a relationship between the parameter and the SOC is defined.

17. The method for estimating a SOC of a secondary battery according to claim 14, wherein the SOC of the secondary battery is estimated by using a look-up function in which the parameter is an input variable and the SOC is an output variable.

18. The method for estimating a SOC of a secondary battery according to claim 14, wherein the charging is pulse charging which repeats at time intervals.

19. The method for estimating a SOC of a secondary battery according to claim 18, wherein in the steps (b) to (d), a SOC of the secondary battery is estimated whenever the pulse charging repeats.

20. The method for estimating a SOC of a secondary battery according to claim 18, wherein during each pulse charging, a SOC of the secondary battery is estimated when the condition of identifying the dynamic voltage profile as the transition region voltage pattern is established.

21. The method for estimating a SOC of a secondary battery according to claim 14, further comprising:
displaying the estimated SOC through a graphic interface.

22. The method for estimating a SOC of a secondary battery according to claim 14, further comprising:
storing the estimated SOC.

23. The method for estimating a SOC of a secondary battery according to claim 14, further comprising:
outputting the estimated SOC.

24. The method for estimating a SOC of a secondary battery according to claim 14, the secondary battery loaded on an electric vehicle supporting a hybrid electric vehicle (HEV) mode, wherein in the step (a) the dynamic voltage of the secondary battery is measured during charging of the secondary battery in the HEV mode.

* * * * *